(12) United States Patent
Kozicki

(10) Patent No.: US 11,244,722 B2
(45) Date of Patent: Feb. 8, 2022

(54) PROGRAMMABLE INTERPOSERS FOR ELECTRICALLY CONNECTING INTEGRATED CIRCUITS

(71) Applicant: Michael Kozicki, Phoenix, AZ (US)

(72) Inventor: Michael Kozicki, Phoenix, AZ (US)

(73) Assignee: ARIZONA BOARD OF REGENTS ON BEHALF OF ARIZONA STATE UNIVERSITY, Scottsdale, AZ (US)

( * ) Notice: Subject to any disclaimer, the term of this patent is extended or adjusted under 35 U.S.C. 154(b) by 0 days.

(21) Appl. No.: 17/025,523

(22) Filed: Sep. 18, 2020

(65) Prior Publication Data

US 2021/0090649 A1 Mar. 25, 2021

Related U.S. Application Data

(60) Provisional application No. 62/903,399, filed on Sep. 20, 2019.

(51) Int. Cl.
*G11C 13/00* (2006.01)
*H01L 27/24* (2006.01)
(Continued)

(52) U.S. Cl.
CPC .......... *G11C 13/0011* (2013.01); *H01L 23/40* (2013.01); *H01L 23/528* (2013.01); *H01L 27/24* (2013.01); *H01L 45/085* (2013.01)

(58) Field of Classification Search
None
See application file for complete search history.

(56) References Cited

U.S. PATENT DOCUMENTS

| 4,712,879 A | 12/1987 | Lynam et al. |
| 4,904,338 A | 2/1990 | Kozicki |

(Continued)

FOREIGN PATENT DOCUMENTS

| KR | 101566949 B1 | 11/2015 |
| WO | WO1997048032 A2 | 12/1997 |

(Continued)

OTHER PUBLICATIONS

Abtew, M. Zhang, and D. A. Drabold, "Ab initio estimate of temperature dependence of electrical conductivity in a model amorphous material: Hydrogenated amorphous silicon," Phys. Rev. B 76, 045212 (2007).

(Continued)

*Primary Examiner* — James G Norman
(74) *Attorney, Agent, or Firm* — Michael Best & Friedrich LLP

(57) ABSTRACT

Programmable interposers for connecting integrated circuits, methods for programming programmable interposers, and integrated circuit packaging are provided. The programmable interposers are electrically reconfigurable to allow custom system-in-package (SiP) operation and configuration, field configurability, and functional obfuscation for secure integrated circuits fabricated in non-trusted environments. The programmable interposer includes, in one implementation, an interposer substrate and a programmable metallization cell (PMC) switch. The PMC switch is formed on the interposer substrate and is coupled between a signal input and a signal output. The PMC switch is electrically configurable between a high resistance state and a low resistance state.

19 Claims, 8 Drawing Sheets

(51) Int. Cl.
*H01L 23/528* (2006.01)
*H01L 23/40* (2006.01)
*H01L 45/00* (2006.01)

(56) References Cited

U.S. PATENT DOCUMENTS

| | | | |
|---|---|---|---|
| 5,314,772 A | 5/1994 | Kozicki et al. |
| 5,434,917 A | 7/1995 | Naccache et al. |
| 5,761,115 A | 6/1998 | Kozicki et al. |
| 5,896,312 A | 4/1999 | Kozicki et al. |
| 5,914,893 A | 6/1999 | Kozicki et al. |
| 6,084,796 A | 7/2000 | Kozicki et al. |
| 6,388,324 B2 | 5/2002 | Kozicki |
| 6,418,049 B1 | 7/2002 | Kozicki et al. |
| 6,469,364 B1 | 10/2002 | Kozicki |
| 6,487,106 B1 | 11/2002 | Kozicki |
| 6,635,914 B2 | 10/2003 | Kozicki et al. |
| 6,798,692 B2 | 9/2004 | Kozicki et al. |
| 6,825,489 B2 | 11/2004 | Kozicki |
| 6,865,117 B2 | 3/2005 | Kozicki |
| 6,914,802 B2 | 7/2005 | Kozicki |
| 6,927,411 B2 | 8/2005 | Kozicki |
| 6,940,745 B2 | 9/2005 | Kozicki |
| 6,985,378 B2 | 1/2006 | Kozicki |
| 6,998,312 B2 | 2/2006 | Kozicki et al. |
| 7,006,376 B2 | 2/2006 | Kozicki |
| 7,085,928 B1 | 8/2006 | Schmid et al. |
| 7,101,728 B2 | 9/2006 | Kozicki et al. |
| 7,142,450 B2 | 11/2006 | Kozicki et al. |
| 7,145,794 B2 | 12/2006 | Kozicki |
| 7,169,635 B2 | 1/2007 | Kozicki et al. |
| 7,180,104 B2 | 2/2007 | Kozicki |
| 7,227,169 B2 | 6/2007 | Kozicki |
| 7,288,781 B2 | 10/2007 | Kozicki |
| 7,294,875 B2 | 11/2007 | Kozicki |
| 7,372,065 B2 | 5/2008 | Kozicki et al. |
| 7,385,219 B2 | 6/2008 | Kozicki et al. |
| 7,402,847 B2 | 7/2008 | Kozicki et al. |
| 7,405,967 B2 | 7/2008 | Kozicki et al. |
| 7,560,722 B2 | 7/2009 | Kozicki |
| 7,675,766 B2 | 3/2010 | Kozicki |
| 7,728,322 B2 | 6/2010 | Kozicki |
| 7,763,158 B2 | 7/2010 | Kozicki |
| 7,929,331 B2 | 4/2011 | Kozicki |
| 8,022,384 B2 | 9/2011 | Kozicki |
| 8,134,140 B2 | 3/2012 | Kozicki |
| 8,213,217 B2 | 7/2012 | Kozicki |
| 8,213,218 B2 | 7/2012 | Kozicki |
| 8,218,350 B2 | 7/2012 | Kozicki |
| 8,300,450 B2 | 10/2012 | Christensen et al. |
| 8,742,531 B2 | 6/2014 | Kozicki |
| 8,941,089 B2 | 1/2015 | Gopalan et al. |
| 8,999,819 B2 | 4/2015 | Kozicki et al. |
| 9,165,644 B2 | 10/2015 | Kamalanathan et al. |
| 9,773,141 B2 | 9/2017 | Kozicki |
| 9,836,633 B2 | 12/2017 | Kozicki |
| 9,971,566 B2 | 5/2018 | Cambou |
| 9,985,791 B2 | 5/2018 | Cambou |
| 10,074,000 B2 | 9/2018 | Kozicki |
| 10,090,840 B1* | 10/2018 | Lee ............... G11C 13/0069 |
| 10,223,567 B2 | 3/2019 | Kozicki |
| 10,466,969 B2 | 11/2019 | Kozicki et al. |
| 10,467,447 B1 | 11/2019 | Kozicki |
| 10,558,172 B2 | 2/2020 | Kozicki |
| 10,644,892 B2 | 6/2020 | Afghah et al. |
| 10,710,070 B2 | 7/2020 | Kozicki |
| 10,810,731 B2 | 10/2020 | Kozicki |
| 2003/0107105 A1 | 6/2003 | Kozicki |
| 2004/0101729 A1 | 5/2004 | Kearl |
| 2004/0124407 A1 | 7/2004 | Kozicki et al. |
| 2005/0225413 A1 | 10/2005 | Kozicki et al. |
| 2006/0238185 A1 | 10/2006 | Kozicki |
| 2006/0291364 A1 | 12/2006 | Kozicki |
| 2007/0285148 A1* | 12/2007 | Sakamoto ............ H01L 45/085 327/365 |
| 2008/0231418 A1 | 9/2008 | Ophey et al. |
| 2008/0296697 A1* | 12/2008 | Hsu ..................... H01L 23/645 257/379 |
| 2010/0199104 A1 | 8/2010 | Van Rijnswou |
| 2011/0180775 A1 | 7/2011 | Lin et al. |
| 2011/0254141 A1 | 10/2011 | Roest et al. |
| 2012/0183135 A1 | 7/2012 | Paral et al. |
| 2013/0220413 A1 | 8/2013 | Kozicki et al. |
| 2015/0071432 A1 | 3/2015 | Zhu et al. |
| 2015/0194545 A1 | 7/2015 | Kozicki et al. |
| 2015/0195088 A1 | 7/2015 | Rostami et al. |
| 2015/0304115 A1 | 10/2015 | Kim et al. |
| 2018/0088059 A1 | 3/2018 | Kozicki |
| 2019/0197265 A1 | 6/2019 | Kozicki |
| 2019/0378638 A1 | 12/2019 | Liu et al. |
| 2020/0036037 A1 | 1/2020 | Krause et al. |
| 2020/0117882 A1 | 4/2020 | Kozicki |
| 2020/0272797 A1 | 8/2020 | Kozicki |
| 2020/0338556 A1 | 10/2020 | Kozicki et al. |
| 2020/0381372 A1 | 12/2020 | Kozicki et al. |
| 2021/0175185 A1 | 6/2021 | Kozicki et al. |

FOREIGN PATENT DOCUMENTS

| | | |
|---|---|---|
| WO | WO1997048032 A3 | 12/1997 |
| WO | WO1999028914 A2 | 6/1999 |
| WO | WO2000048196 A1 | 8/2000 |
| WO | WO2002021542 A1 | 3/2002 |
| WO | WO2002082452 A2 | 10/2002 |
| WO | WO2002099517 A2 | 12/2002 |
| WO | WO2003028098 A2 | 4/2003 |
| WO | WO2003032392 A2 | 4/2003 |
| WO | WO2003036735 A2 | 5/2003 |
| WO | WO2003058638 A1 | 7/2003 |
| WO | WO2003079463 A2 | 9/2003 |
| WO | WO2005083810 A2 | 9/2005 |
| WO | WO2005124788 A2 | 12/2005 |
| WO | WO2006043185 A1 | 4/2006 |
| WO | WO2008120128 A2 | 10/2009 |
| WO | WO2012065076 A1 | 5/2012 |
| WO | WO2018175973 A1 | 9/2018 |

OTHER PUBLICATIONS

Afghah et al., Concatenation of space-time block codes and LDPC codes. The 13th INTNSPS, 2008. 1-5.

Alajerami, K. Cimatu, G. Chen and D. A. Drabold, Radiation shielding properties of Bismuth Borate glasses doped with Cadmium Oxide, Ceramics International 46 12718 (2020).

Allen and J. Q. Broughton, "Electrical Conductivity and Electronic Properties of Liquid Silicon," J. Phys.Chem. 91, 4964 (1987).

Auguste, "La cryptographie militaire," Journal des sciences militaires, vol. 9, pp. 5-38, 1883.

Balakrishnan, S. C. P. Thermadam, M. Mitkova, and M. N. Kozicki, "A Low Power Non-Volatile Memory Element Based on Copper in Deposited Silicon Oxide," in 2006 7th Annual Non-Volatile Memory Technology Symposium, 2006, pp. 104-110.

Baranger et al., Electrical linear-response theory in an arbitrary magnetic field: A new Fermi-surface formation, Phys. Rev. B 40, 8169 (1989).

Barranco, F. Yubero, J. P. Espinos, P. Groening, A. R. Gonzalez-Elipe, Electronic state characterization of SiOx thin films prepared by evaporation, J. Appl. Phys. 97, 113714 (2005).

Barranco, J. A. Mejias, J. P. Espinos, A. Caballero, A. R. Gonzalez-Elipe, F. Yubero, Chemical stability of Si+n species in SiOx (x<2) thin films, J. Vac. Sci. Technol. A 19(1) Jan./Feb. 2001.

Barranco, J. Cotrino, F. Yubero, J. P. Espinos, A. R. Gonzalez-Elipe, Room temperature synthesis of porous SiO2 thin-films by plasma enhan.ced chemical vapor deposition, J. Vac. Sci. Technol. A (4), Jul./Aug. 2004.

Bartók, J Kermode, N Bernstein, G Csányi, Machine learning a general-purpose interatomic potential for silicon, Phys. Rev. X 8 041048 (2018).

Belandi et al., SiO2 Etch Rate Modification by Ion Implantation, Solid State Phenomena, vol. 195, pp. 55-57, Dec. 2012.

(56) References Cited

OTHER PUBLICATIONS

Bernard, V. T. Renard, P. Gonon, and V. Jousseaume, "Back-end-of-line compatible Conductive Bridging RAM based on Cu and SiO2," Microelectron. Eng., vol. 88, No. 5, pp. 814-816, 2011.
Bernstein, B. Bhattarai, G. Csányi, D. A. Drabold, S. R. Elliott, V. L. Deringer, Quantifying Chemical Structure and Atomic Energies in Amorphous Silicon Networks, Angewandte Chemie 58 7057 (2019).
Berrou et al., Near Optimum Error Correcting Coding and Decoding: Turbo-Codes; IEEE Trans. on Communications 44, No. 10 (1996): 1261-1271.
Bhattarai and D. A. Drabold, Vibrations in amorphous silica, J. Non. Cryst. Sol. 439 6 (2016).
Bhattarai, A. Pandey and D. A. Drabold, Evolution of amorphous carbon across densities, an inferential study, Carbon 131 168 (2018).
Bhattarai, P. Biswas, R. Atta-Fynn and D. A. Drabold, Amorphous graphene: a constituent part of low density amorphous carbon, Phys. Chem. Chem. Phys. 20 19546 (2018).
Bhattarai, R. Thapa and D. A. Drabold, Ab initio inversion of structure and the lattice dynamics of a metallic glass: the case of Pd40Ni40P20, Modeling and Simulation in Materials Science and Engineering 27 075002 (2019).
Binnig, H. Rohrer, Ch. Gerber, and E. Weibel, 7×7 Reconstruction on Si(111) Resolved in Real Space, Phys. Rev. Lett. 50 120 (1983).
Boyd and J. I. B. Wilson, A study on thin silicon dioxide films using infrared absorption techniques, J. App. Phys. 53 (6), pp. 4166-4171, Jun. 1982.
Brier et al., "Correlation power analysis with a leakage model," in International Workshop on Cryptographic Hardware and Embedded Systems, 2004, pp. 16-29.
Cambou et al., Integrated Technology and policy Enabling Large-Scale Deployment of UAVs: Trustworthiness and Threat Mitigation; IEEE workshop on IoT security, Arlington, Feb. 2016.
Cambou et al., PUF designed with ReRAM and ternary states; CISR 2016, pp. 1-8.
Cambou, F. Afghah, D. Sonderegger, J. Taggart, H. Barnaby, M. N. Kozicki, Ag conductive bridge RAMs for physical unclonable functions, Proceeding of the IEEE HOST Conference, 2017, vol. 1, pp. 151-151.
Cao et al., CMOS image based PUF for coherent sensor-level authentication; IEEE trans. on circuits and systems, vol. 62, issue 11, pp. 2629-2640. 2015.
Carboni and D. Ielmini (2019) Stochastic Memory Devices for Security and Computing, Adv. Electron. Mater. 2019, pp. 1900198, DOI: 10.1002/aelm.201900198.
Casini, Understanding Machine Learning effectiveness to protect WEB authentication, Venezia: Universita Ca Foscari, 2014.
Chen et al., "Exploiting resistive cross-point array for compact design of physical unclonable function," in IEEE International Symposium on Hardware Oriented Security and Trust—HOST, 2015, pp. 26-31.
Chen et al., "Total-Ionizing-Dose Effects on Resistance Stability of Programmable Metallization Cell Based Memory and Selectors," IEEE Trans. Nucl. Sci., vol. 64, No. 1, pp. 269-276, 2017.
Chen, J. Wu, Q. Zhang and X. Su, Recent advancement of SiOx based anodes for lithium-ion batteries, J. Power Sources 363, 126 (2017).
Chen, S. Tappertzhofen, H. Barnaby, M. N. Kozicki, SiO2 based conductive bridging random access memory, J Electroceram (2017) 39:109-131.
Chen, W. et al., "Volatile and Non-Volatile Switching in Cu—SiO2 Programmable Metallization Cells", IEEE Electron Device Letters, May 2016 [IEEE Date of Publication: Mar. 2016], vol. 37, No. 5, pp. 580-583 <DOI:10.1109/LED.2016.2540361>.
Choi et al., "Data clustering using memristor networks," Scientific Reports, 5:10492, 2015.
College Transitions, "Top Honors Programs," <https://www.collegetransitions.com/dataverse/top-honors-programs> publicly available at least as early as Oct. 16, 2019.
Cortez et al., "Modeling SRAM start-up behavior for physical unclonable functions," in 2012 IEEE International Symposium on Defect and Fault Tolerance in VLSI and Nanotechnology Systems (DFT), 2012, pp. 1-6.
Coteus et al., "Technologies for exascale systems," IBM Journal of Research and Development, 55(5):14, 2011.
Damiani et al., "New paradigms for access control in open environments," in Proceedings of the 5th IEEE International Symposium on Signal Processing and Information Technology, 2005, pp. 540-545.
De Los Santos Valladares et al., "Crystallization and electrical resistivity of Cu2O and CuO obtained by thermal oxidation of Cu thin films on SiO2/Si substrates," Thin Solid Films, vol. 520, No. 20, pp. 6368-6374, 2012.
Dearnaley, A. Stoneham, D. Morgan, Electrical phenomena in amorphous oxide films. Rep. Prog. Phys. 33, 1129 (1970).
Defense Advanced Research Projects Agency (DARPA), "Supply Chain Hardware Integrity for Electronics Defense (SHIELD)," <https://www.darpa.mil/program/supply-chain-hardware-integrity-for-electronics-defense> publicly available at least as early as Jul. 2015.
Deringer, N. Bernstein, G. Csanyi, M. Wilson, D. A. Drabold and S. R. Elliott, Structural transitions in dense disordered silicon from quantum-accurate ultra-large-scale simulations, Submitted to Nature Dec. 2019.
Devadas et al., "Design and implementation of PUF-based 'unclonable' RFID ICs for anti-counterfeiting and security applications," in IEEE International conference on RFID, 2008, pp. 58-64.
Dong and D. A. Drabold, Atomistic structure of band tail states in amorphous silicon, Phys. Rev. Lett. 80 1928 (1998).
Dong and D. A. Drabold, Ring formation and the structural and electronic properties of tetrahedral amorphous carbon surfaces, Phys. Rev. B 57 15591 (1998).
Drabold, "David Drabold Distinguished Professor of Physics," Ohio University, <https://daviddrabold.com/people/> publicly available at least as early as Feb. 9, 2019.
Drabold, Topics in the theory of amorphous materials, European Physical Journal B 68 1 (2009).
Economou and C. M. Soukoulis, Static Conductance and Scaling Theory of Localization in One Dimension, Phys. Rev. Lett. 46, 618 (1981).
Falk et al., New Directions in Applying Physical Unclonable Functions; Secuware 2015.
Fei et al., "A statistical model for DPA with novel algorithmic confusion analysis," in International Workshop on Cryptographic Hardware and Embedded Systems, 2012, pp. 233-250.
Fei et al., "A statistics-based fundamental model for side-channel attack analysis." IACR Cryptology ePrint Archive, vol. 2014, p. 152, 2014.
Galli, R. M. Martin, R. Car, and M. Parrinello, "Ab initio calculation of properties of carbon in the amorphous and liquid states," Phys. Rev. B 42,7470 (1990).
Gao et al., "Memristive crypto primitive for building highly secure physical unclonable functions," Scientific Reports, 5:12785, 2015.
Gao et al., "mrPUF: A novel memristive device based physical unclonable function," in Applied Cryptography and Network Security, 2015, pp. 595-615.
Gao et al., Exploiting Unreliability of the PUF to Secure Remote Wireless Sensing; Int. association for cryptologic research, 2015:1240, 2015.
Gao, L. et al., "Physical Unclonable Function Exploiting Sneak Paths in Resistive Cross-point Array", IEEE Transactions on Electron Devices, Aug. 2016 [IEEE date of publication: Jun. 2016], vol. 63, No. 8, pp. 3109-3115 <DOI:10.1109/TED.2016.2578720>.
Gao, S. F. Al-Sarawi, D. Abbott, Physical unclonable functions. Nat Electron 3, 81-91 (2020).
Garcia-Valenzuela, R. Alvarez, J.-P. Espinos, V. Rico, J. Gil-Rostra, A. Palmero, A. R. Gonzalez-Elipe, SiOx by magnetron sputtered revisited: Tailoring the photonic properties of multilayers, Appl. Surf. Sciences 488, pp. 791-800, (2019).
Gassend et al., "Identification and authentication of integrated circuits," Concurrency and Computation: Practice and Experience, vol. 16, No. 11, pp. 1077-1098, 2004.

(56) References Cited

OTHER PUBLICATIONS

Gassend; Physical random functions; M.S. thesis, Dept. Electr. Eng. Comput. Sci., MA, USA, Massachusetts Inst. Technol., Cambridge, 2003.
Ghijsen et al., "Electronic structure of Cu2O and CuO," Phys. Rev. B, vol. 38, No. 16, pp. 11322-11330, 1988.
Gilbert et al. "A 0.6 V 8 pJ/write Non-Volatile CBRAM Macro Embedded in a Body Sensor Node for Ultra Low Energy Applications." VLSI Circuits (VLSIC), 2013 Symposium on. IEEE, 2013.
Gopalan et al., "Demonstration of Conductive Bridging Random Access Memory (CBRAM) in logic CMOS process," Solid. State. Electron., vol. 58, No. 1, pp. 54-61, 2011.
Gopalan, M. N. Kozicki, S. Bhagat, S. C. Puthen Thermadam, T. L. Alford, and M. Mitkova, "Structure of copper-doped tungsten oxide films for solid-state memory," J. Non. Cryst. Solids, vol. 353, No. 18-21, pp. 1844-1848, 2007.
Grassini, M. Ishtaiwi, M. Parvis, L. Benussi, S. Bianco, S. Colafranceschi, D. Piccolo, SiOx coated plastic fiber optic sensor for gas monitoring in RPC, Proceeding of Science, (RPC2012)072.
Guajardo et al., "Brand and IP protection with physical unclonable functions," in IEEE International Symposium on Circuits and Systems (ISCAS), 2008, pp. 3186-3189.
Guajardo et al., "FPGA intrinsic PDFs and their use for IP protection," in International workshop on Cryptographic Hardware and Embedded Systems, 2007, pp. 63-80.
Guajardo et al., Physical Unclonable Functions and Public Key Crypto for FPGA IP Protection. In: International Conference on Field Programmable Logic and Applications—FPL 2007, Aug. 27-30, 2007, pp. 189-195. IEEE, Los Alamitos (2007).
Han and M. Tao, "Electrochemically deposited P—N homojunction cuprous oxide solar cells," Sol. Energy Mater. Sol. Cells, vol. 93, No. 1, pp. 153-157, 2009.
Helfmeier et al., "Cloning physically unclonable functions," in IEEE International Symposium on Hardware-Oriented Security and Trust—HOST, 2013, pp. 1-6.
Helfmeier et al.; Physical Vulnerabilities of PUFs; Proceedings of the conference on Design, Automation & Test (DARE'14). Belgium, 2014.
Herasimenka, W. J. Dauksher, M. Boccard, S. Bowden, ITO/SiOx:H stacks for silicon heterojunction solar cells, Solar Energy Materials & Solar Cells158 (2016) pp. 98-101.
Herder et al., "Physical Unclonable Functions: A Tutorial," Proc. IEEE, vol. 102 (2014) 1126-1141.
Hernandez, P. Miska, M. Grun, S. Estrade, F. Peiro, B. Garrido, M. Vergant, P. Pellegrino, Tailoring the Surface density of silicon nanocrystals embedded in SiOx single layers, J. Appl. Phys. 114, 233101 (2013).
Hofer et al., Error correction coding for physical unclonable functions. In: Austrochip, Workshop on Microelectronics, 2010.
Holcomb et al., "Initial SRAM state as a fingerprint and source of true random numbers for RFID tags," in Proceedings of the Conference on RFID Security, vol. 7, 2007.
Hori et al., "Quantitative and statistical performance evaluation of arbiter physical unclonable functions on FPGAs," in IEEE International Conference on Reconfigurable Computing and FPGAs (ReConFig), 2010, pp. 298-303.
Hu et al., "Physically unclonable cryptographic primitives using self-assembled carbon nanotubes," Nature Nanotechnology, vol. 11, No. 6, pp. 559-565, 2016.
Hvarinen et al., Independent Component Analysis, algorithms, and applications; Neural Networks, vol. 13, 411-430, 2000.
Igram, B. Bhattarai, P. Biswas and D. A. Drabold, Large and realistic models of amorphous silicon, J. Non-Cryst. Sol 492 27 (2018).
Igram, H. Castillo and D. A. Drabold, Structure and dynamics of an Ag-doped chalcogenide glass, an ab initio study, J. Non-Cryst. Sol. 514 1 (2019).
Inam and D. A. Drabold, Theoretical study of an amorphous chalcogenide surface. J. Non-Cryst. Sol. 354 2495 (2008).
International Preliminary Report on Patentability for Application No. PCT/US2018/024156 dated Oct. 3, 2019 (14 pages).
International Search Report and Written Opinion for Application No. PCT/US2018/024156 dated Jul. 13, 2018 (16 pages).
Jayatissa, K. Guo, and A. C. Jayasuriya, "Fabrication of cuprous and cupric oxide thin films by heat treatment," Appl. Surf. Sci., vol. 255, No. 23, pp. 9474-9479, 2009.
Je, J. Kim, J. C. Harrison, M. N. Kozicki, and J. Chae, "In situ tuning of omnidirectional microelectromechanical-systems microphones to improve performance fit in hearing aids," Appl. Phys. Lett., vol. 93, No. 12, pp. 1-4, 2008.
Joseph et al., "Machine Learning Methods for computer security," Dagstuhl Perspective Workshop 12371, 2012.
Kaganov, "Machine Learning Methods in Authentication Problems using Password Keystroke dynamics," Computational Mathematics and Modeling, vol. 26, No. 3, pp. 398-407, 2015.
Kang, B. Arnold, C. J. Summers, B. K. Wagner, Synthesis of silicon quantum dot buried SiOx films with controlled luminescent properties for solid-state lighting, Nanotechnology 17 (2006) pp. 4477-4482.
Katzenbeisser et al.; PUFs: Myth, Fact or Busted? A Security Evaluation of Physically Unclonable Functions Cast in Silicon; CHES, 2012, pp. 283-301.
Kilian, D. A. Drabold and J. B. Adams, First principles simulations of a-Si and a-Si:H surfaces, Phys. Rev. B 48 17393 (1993).
Kim et al., "A Physical Unclonable Function with Redox-based Nanoionic Resistive Memory," arXiv:1611.04665v1 [cs.ET], (2016).
Kinget, "Device mismatch and tradeoffs in the design of analog circuits," IEEE Journal of Solid-State Circuits, vol. 40, No. 6, pp. 1212-1224, 2005.
Klingsporn, S. Kirner, C. Villringer, D. Abou-Ras, I. Costina, M. Lehmann, and B. Stannowski, Resolving the nanostructure of plasma-enhanced chemical vapor deposited nanocrystalline SiOx layers for application in solar cells, J. Appl. Phys. 119, 223104 (2016).
Kobayashi et al., "A current-mode latch sense amplifier and a static power saving input buffer for low-power architecture," in Symposium on VLSI Circuits, 1992, pp. 28-29.
Kocher et al., "Introduction to differential power analysis," Journal of Cryptographic Engineering, vol. 1, No. 1, pp. 5-27, 2011.
Koeberl et al., "Memristor PUFs: a new generation of memory-based physically unclonable functions," in Proceedings of the Conference on Design, Automation and Test in Europe, 2013, pp. 428-431.
Koffyberg and F. A. Benko, "A photoelectrochemical determination of the position of the conduction and valence band edges of p-type CuO," J. Appl. Phys., vol. 53, No. 2, pp. 1173-1177, 1982.
Konstantinou et al., "Cyber-physical systems: A security perspective," in 20th IEEE European Test Symposium (ETS), 2015, pp. 1-8.
Kozicki and H. J. Barnaby, "Conductive bridging random access memory—Materials, devices and applications," Semicond. Sci. Technol., vol. 31, No. 11, 2016.
Kozicki et al., "Mass transport in chalcogenide electrolyte films—materials and applications," J. of Non-Crystalline Solids, vol. 352, pp. 567-577, Mar. 2006.
Kozicki et al., "Nonvolatile memory based on solid electrolytes," in Proc. IEEE Non-Volatile Memory Technol. Symp., pp. 10-17, 2004.
Kozicki et al., "Nanoscale memory elements based on solid-state electrolytes," IEEE Trans. Nanotechnol, vol. 4, pp. 331-338, May 2005.
Kozicki et al., "Programmable metallization cell memory based on Ag—Ge—S and Cu—Ge—S solid electrolytes," Proc. NVMTS, p. 83-89, 2005.
Kozicki, C. Gopalan, M. Balakrishnan, and M. Mitkova, "A low-power nonvolatile switching element based on copper-tungsten oxide solid electrolyte," IEEE Trans. Nanotechnol., vol. 5, No. 5, pp. 535-544, 2006.
Kozicki, M. Mitkova, M. Park, M. Balakrishnan, and C. Gopalan, "Information storage using nanoscale electrodeposition of metal in solid electrolytes," Superlattices Microstruct., vol. 34, No. 3-6, pp. 459-465, 2003.

(56) References Cited

OTHER PUBLICATIONS

Kozicki, P. Maroufkhani, and M. Mitkova, "Valving in microchannels via electrodeposition on solid electrolytes," vol. 1, No. January, pp. 716-719, 2005.

Kozicki, Y. Gonzalez-Velo, A. Patadia, P. Apsangi, H. J. Barnaby, J. Allgair, B. Attaway, J. Callahan, S. Follis, J. Morris, S. Shive, A. Velaga, Copper-Silicon oxide resistive memory: A versatile back-end-of-line technology, invited presentation, Memrisys 2019, Dresden, Jul. 8-11.

Kresse et al., "Efficiency of ab-initio total energy calculations for metals and semiconductors using a plane-wave basis set," Comput. Mater. Sci. 6:15-50 (1996).

Kresse et al., "Efficient iterative schemes for ab initio total-energy calculations using a plane-wave basis set," Phys. Rev. B 54(16):11169-11186 (1996).

Kumar et al., "The butterfly PUF protecting IP on every FPGA," in IEEE International Workshop on Hardware-Oriented Security and Trust—HOST, 2008, pp. 67-70.

Kuzmin, A. Anspoks, A. Kalinko, J. Timoshenko, and R. Kalendarev, "X-ray absorption spectroscopy of Cu-doped WO3 films for use in electrochemical metallization cell memory," J. Non. Cryst. Solids, vol. 401, pp. 87-91, 2014.

Kwon et al., "Nanoscale CuO solid-electrolyte-based conductive-bridging-random-access-memory cell operating multi-level-cell and 1selector1resistor," J. Mater. Chem. C, vol. 3, No. 37, pp. 9540-9550, 2015.

Legenstein, "Computer science: Nanoscale connections for brain-like circuits," Nature, vol. 521, No. 7550, pp. 37-38, 2015.

Lim et al., "Extracting secret keys from integrated circuits," IEEE Transactions on Very Large Scale Integration (VLSI) Systems, vol. 13, No. 10, pp. 1200-1205, 2005.

Llyod, Least Squares Quantization in PCM; IEEE Transactions on Information Theory 18, No. 2 (1982).

Lucovsky, J. Manitini, Low temperature growth of silicon dioxide films: A study of chemical bonding by ellipsometry and infra-red spectroscopy, J. Vac. Sci. Technol. B 5 (2) Mar./Apr. 1987.

Ludlam, S. N. Taraskin, S. R. Elliott and D. A. Drabold, Universal features of eigenstates in disordered systems, J. Phys. Cond. Matter 17 L321 (2005).

Luo et al., "Algorithmic collision analysis for evaluating cryptographic systems and side-channel attacks," in IEEE International Symposium on Hardware-Oriented Security and Trust (HOST), 2011, pp. 75-80.

Maes et al., A Soft Decision Helper Data Algorithm for SRAM PUFs; 2016 IEEE International Symposium on Information Theory. 2009.

Maes, "Physically unclonable functions: Constructions, properties and applications," Ph.D. dissertation, Ph. D. thesis, Dissertation, University of KU Leuven, 2012.

Maiti et al., "A robust physical unclonable function with enhanced challenge-response set," IEEE Transactions on Information Forensics and Security, vol. 7, No. 1, pp. 333-345, 2012.

Majzoobi et al., "Slender PUF protocol: A lightweight, robust, and secure authentication by substring matching," in IEEE Symposium on Security and Privacy Workshops—SPW, 2012, pp. 33-44.

Majzoobi et al., "Techniques for design and implementation of secure reconfigurable PUFs," ACM Transactions on Reconfigurable Technology and Systems (TRETS), vol. 2, No. 1, pp. 5:1-5:33, 2009.

Majzoobi et al., "Testing techniques for hardware security," in IEEE International Test Conference (ITC), 2008, pp. 1-10.

Mannion, A. Mehonic, W. H. Ng, A. J. Kenyon, Memristor-Based Edge Detection for Spike Encoded Pixels, Front. Neurosci. 13:1386, 2020.

Mehonic, A. J. Kenyon, Emulating the Electrical Activity of the Neuron Using a Silicon Oxide RRAM Cell, Front.Neurosci.10:57, 2016.

Mehonic, A. L. Shluger, D. Gao, I. Valov, E. Miranda, D. Ielmini, A. Bricalli, E. Ambrosi, C. Li, J. J. Yang, Q. Xia, A. J. Kenyon, Silicon Oxide (SiOx): A Promising Material for Resistance Switching?, Adv. Mater. 2018, 30, 1801187.

Mehonic, M. Buckwell, L. Montesi, L. Garnett, S. Hudziak, S. Fearn, R. Chater, D. McPhail, A. J. Kenyon, Structural changes and conductance thresholds in metal-free intrinsic SiOx resistive random access memory, J. Appl. Phys. 117, 124505 (2015).

Mehonic, M. Buckwell, L. Montesi, M. S. Munde, D. Gao, S. Hudziak, R. J. Chater, S. Fearn, D. McPhail, M. Bosman, A. L. Shluger, A. J. Kenyon, Nanoscale Transformations in Metastable, Amorphous, Silicon-Rich Silica Adv. Mater. 2016, 28, 7486-7493.

Mehonic, M.S. Munde, W.H. Ng, M. Buckwell, L. Montesi, M. Bosman, A.L. Shluger, A.J. Kenyon, Intrinsic resistance switching in amorphous silicon oxide for high performance SiOx ReRAM devices, Microelectronic Engineering, 178, 2017, pp. 98-103, (2017).

Mehonic, S. Cueff, M. Wojdak, S. Hudziak, C. Labbe, R. Rizk, A. J Kenyon, Electrically tailored resistance switching in silicon oxide, Nanotechnology 23 (2012) 455201 (9pp).

Mehonic, S. Cueff, M. Wojdak, S. Hudziak, O. Jambois, C. Labbe, B. Garrido, R. Rizk, A. J. Kenyon, Resistive switching in silicon suboxide films, J. Appl. Phys. 111, 074507 (2012).

Messerges et al., "Examining smart-card security under the threat of power analysis attacks," IEEE Transactions on Computers, vol. 51, No. 5, pp. 541-552, 2002.

Mickel et al., "A physical model of switching dynamics in tantalum oxide memristive devices," Appl. Phys. Lett., vol. 102, p. 223502, 2013.

Mitkova and M. N. Kozicki, "Silver incorporation in Ge—Se glasses used in programmable metallization cell devices," J. Non. Cryst. Solids, vol. 299-302, No. Part 2, pp. 1023-1027, 2002.

Moore, "Moore's Law ,Electronics," vol. 38, No. 8, p. 114, 1965.

Munde, A. Mehonic, W. H. Ng , M. Buckwell, L. Montesi, M. Bosman, A. L. Shluger, A. J. Kenyon, Intrinsic Resistance Switching in Amorphous Silicon Suboxides: The Role of Columnar Microstructure, Scientific Reports 7: 9274, 2017.

Murarka, "Multilevel interconnections for ULSI and GSI era," Mater. Sci. Eng. R Reports, vol. 19, No. 3-4, pp. 87-151, 1997.

Nandakumar, S. et al., "Physics-based switching model for Cu/SiO2/W quantum memristor", 2016 74th Annual Device Research Conference (DRC) (Jun. 19-22, 2016, Newark, DE, USA), Date Added to IEEE Xplore: Aug. 2016, 2 pages <DOI:10.1109/DRC.2016.7548509>.

National Public Radio, "Internet Of Things' Hacking Attack Led To Widespread Outage Of Popular Websites," <http://www.npr.org/2016/10/22/498954197/internet-outage-update-internet-of-things-hacking-attack-led-to-outage-of-popula>, dated Oct. 22, 2016.

National Science Foundation "Award No. 1507670," <https://www.nsf.gov/awardsearch/showAward?AWD_ID=1507670> publicly available at least as early as Jun. 28, 2017.

National Science Foundation, "Award No. 1506836," <https://www.nsf.gov/awardsearch/showAward?AWD_ID=1506836> publicly available at least as early as Jun. 28, 2017.

Nesheva, C. Raptis, A. Perakis, I. Beneva, Z. Aneva, Z. Levi, S. Alexandrova, H. Hofmeister, Raman scattering and photoluminescence from Si nanoparticles in annealed SiOx thin films, J. Appl. Phys., vol. 92, No. 8, pp. 4678-4683 (2002).

Nessel, R. Q. Lee, C. H. Mueller, M. N. Kozicki, M. Ren, and J. Morse, "A novel nanoionics-based switch for microwave applications," IEEE MTT-S Int. Microw. Symp. Dig., pp. 1050-1054, 2008.

Nili et al., "Donor-induced performance tuning of amorphous SrTiO3 memristive nanodevices: Multistate resistive switching and mechanical tunability," Advanced Functional Materials, vol. 25, No. 21, pp. 3172-3182, 2015.

Nili et al., "Nanoscale resistive switching in amorphous perovskite oxide (a-SrTiO3) memristors," Advanced Functional Materials, vol. 24, No. 43, pp. 6741-6750, 2014.

Nili, H et al., "Highly-Secure Physically Unclonable Cryptographic Primitives Using Nonlinear Conductance and Analog State Tuning in Memristive Crossbar Arrays", arXiv, Submitted Nov. 23, 2016, 25 pages, arXiv:1611.07946v1.

Nosé (1984). A unified formulation of the constant temperature molecular-dynamics methods. Journal of Chemical Physics. 81 511-519 (1984).

(56) References Cited

OTHER PUBLICATIONS

Novikov, V. A. Gritsenko, Short-range order in amorphous SiOx by x-ray photoelectron spectroscopy, J. Appl. Phys. 110, 014107 (2011).

O'Leary, J. H. Thomas, Characterization of reactively evaporated SiOx thin films, Journal of Vacuum Science & Technology A 5, 106 (1987).

Oakeshott and A. MacKinnon, Numerical evaluation of current paths in disordered media, J. Phys.: Condens. Matter 6, 1513 (1994).

Ohio University, "Honors Tutorial College," <https://www.ohio.edu/honors> publicly available at least as early as Apr. 3, 2017.

Oren et al., "On the effectiveness of the remanence decay sidechannel to clone memory-based PUFs," in International Workshop on Cryptographic Hardware and Embedded Systems, 2013, pp. 107-125.

Ori, C. Massobrio, A. Bouzid, B. Coasn, Surface of glassy GeS2: a model based on a first principles approach, Phys. Rev. B 90 045423 (2014).

Oxford Instruments, "Basic PECVD Plasma Processes," <https://nanolab.berkeley.edu/process_manual/chap6/6.20PECVD.pdf> dated 2003.

Oxley, Electroforming, switching and memory effects in oxide thin films. Act. Passive Electron. Compon. 3, 217, 1977.

P. B. Allen, "Electron Transport" in Contemporary Concepts of Condensed Matter Science, Conceptual Foundations of Materials: A Standard Model for Ground- and Excited-State Properties (2006).

Pai, S. S. Chao, Y. Takagi, G. Lucovsky, Infrared spectroscopic study of SiOx films produced by plasma enhanced chemical vapor deposition, J. Vac. Sci. Technol. A 4 (3) May/Jun. 1986.

Pandey, N. Podraza and D. A. Drabold, Electrical activity of boron and phosphorous in hydrogenated amorphous silicon, Phys. Rev. Applied 2 054005 (2014).

Pandey, P. Biswas and D. A. Drabold, Inversion of diffraction data for amorphous materials, Scientific Reports, 6 33731 (2016).

Pandey, P. Biswas and D. A. Drabold, Realistic inversion of diffraction data for an amorphous solid: the case of silicon, Phys. Rev B 94 235208 (2016).

Pandey, P. Biswas and D. A. Drabold, Force enhanced atomic refinement: application to amorphous silica and amorphous silicon, Phys. Rev. B 92 155205 (2015).

Papiora, N. Lorente, T. Frederiksen, A. García, M. Brandbyge, Improvements on non-equilibrium and transport Green function techniques: The next-generation transiesta, Comp. Phys. Comm. 212, 8-24 (2017).

Park, K.S. Kim, M.H. Jung, WJ Cho and J. Jung, Electrical Characteristics of SiO2/High-k Dielectric Stacked Tunnel Barriers for Nonvolatile Memory Applications. Journal of The Korean Physical Society vol. 55. 10.3938/jkps.55.116 (2009).

Pearton, W. H. Heo, M. Ivill, D. P. Norton, and T. Steiner, "Dilute magnetic semiconducting oxides," Semicond. Sci. Technol., vol. 19, No. 10, pp. R59-R74, 2004.

Pelgrom et al., "Matching properties of MOS transistors," IEEE Journal of solid-state circuits, vol. 24, No. 5, pp. 1433-1439, 1989.

Perdew, K. Burke, and M. Ernzerhof, Phys. Rev. Lett. 77, 3865 (1996).

Pliskin, Comparison of properties of dielectric films deposited by various methods, Journ. Of Vac. Sci. and Tech., vol. 14, No. 5, pp. 1064-1081, Sep./Oct. 1977.

Prabhu et al., Extracting Device Fingerprints from Flash Memory by Exploiting Physical Variations; 4th int. conf. on Trust and trustworthy computing; Jun. 2011.

Prasai et al., High precision detection of change in intermediate range order of amorphous zirconia-doped tantala thin films due to annealing, Phys. Rev. Lett. 123 045501 (2019).

Prasai, G. Chen and D. A. Drabold, Amorphous to amorphous insulator-metal transition in GeSe:Ag glasses, Phys. Rev. Materials 1 015603 (2017).

Prasai, P. Biswas and D. A. Drabold, Electronically designed amorphous carbon and silicon, Phys. Stat. Sol. A 213 1653 (2016).

Prasai, P. Biswas and D. A. Drabold, Electrons and Phonons in Amorphous Semiconductors, invited Topical Review in: Semicon. Sci. Tech. 31 073002 (2016).

Prasai, P. Biswas and D. A. Drabold, Sculpting the band gap, a computational approach, Scientific Reports, 5 15522 (2015).

Prasai, P. Biswas, K. Subedi, K, Ferris and D. A. Drabold, Spatial projection of electronic conductivity, the example of conducting bridge computer memory, PSS Rapid Research Letters, https://doi.org/10.1002/pssr.201800238 (2018).

Prezioso et al., "Training and operation of an integrated neuromorphic network based on metal-oxide memristors," Nature, vol. 521, No. 7550, pp. 61-64, 2015.

Price et al., How to Generate Repeatable Keys Using PUF, Correcting PUF Errors with Iteratively Broadening and Prioritized Search; International Association for Cryptologic Research, CHES 2014.

Puthentheradam, S. et al., "Inherent diode isolation in programmable metallization cell resistive memory elements", Applied Physics A, Jan. 2011, vol. 102, pp. 817-826 <DOI:10.1007/s00339-011-6292-5>.

Rajendran et al., "Nano meets security: Exploring nanoelectronic devices for security applications," Proceedings of the IEEE, vol. 103, No. 5, pp. 829-849, 2015.

Rajendran et al., "Nano-PPUF: A memristor-based security primitive," in IEEE Computer Society Annual Symposium on VLSI (ISVLSI), 2012, pp. 84-87.

Ramírez-Ortiz et al., "A catalytic application of Cu2O and CuO films deposited over fiberglass," Appl. Surf. Sci., vol. 174, No. 3-4, pp. 177-184, 2001.

Ranasinghe et al., "Confronting security and privacy threats in modern RFID systems," in Fortieth Asilomar Conference on Signals, Systems and Computers (ACSSC), 2006, pp. 2058-2064.

Razavi, "The StrongARM latch: A circuit for all seasons," IEEE Solid-State Circuits Magazine, vol. 7, No. 2, pp. 12-17, 2015.

Razi et al., Space-Time Block Codes Assisted by Fast Turbo Codes; WiCOM '08. 2008. 1-6.

Razi et al.; Binary Source Estimation Using a Two-Tiered Wireless Sensor Network; Communications Letters, IEEE 15, No. 4 (2011): 449-451.

Remachea, E. Fourmonda, A. Mahdjoubb, J. Dupuisa, M. Lemitia, Design of porous silicon/PECVD SiOx antireflection coatings for silicon solar cells, Materials Science and Engineering B 176 (2011), pp. 45-48.

Rose et al., "A write-time based memristive PUF for hardware security applications," in IEEE/ACM International Conference on Computer-Aided Design (ICCAD), 2013, pp. 830-833.

Rosenfeld et al., Sensor Physical Unclonable Functions; IEEE HOST, pp. 112-117, 2010.

Rostami et al., "Robust and reverse-engineering resilient PUF authentication and key-exchange by substring matching," IEEE Transactions on Emerging Topics in Computing, vol. 2, No. 1, pp. 37-49, 2014.

Rueppel, "Correlation immunity and the summation generator," in Advances in Cryptology—Crypto'85 Proceedings, 1985, pp. 260-272.

Rührmair et al., "Applications of high-capacity crossbar memories in cryptography," IEEE Transactions on Nanotechnology, vol. 10, No. 3, pp. 489-498, 2011.

Rührmair et al., "Modeling attacks on physical unclonable functions," in Proceedings of the 17th ACM Conference on Computerand Communications Security, 2010, pp. 237-249.

Rührmair et al., "PUF modeling attacks on simulated and silicon data," IEEE Transactions on Information Forensics and Security, vol. 8, No. 11, pp. 1876-1891, 2013.

Rührmair et al., "Strong PUFs: models, constructions, and security proofs," in Towards Hardware-Intrinsic Security. Springer, 2010, pp. 79-96.

Schindler, M. Weides, M. N. Kozicki, R. Waser, Low current resistive switching in Cu—SiO2 cells, Appl. Phys. Lett. 92, 122910 (2008).

Shallenberger, Determination of chemistry and microstructure in SiOx (0.1<x<0.8) films by x-ray photoelectron spectroscopy, Journal of Vacuum Science & Technology A 14, 693 (1996).

(56) References Cited

OTHER PUBLICATIONS

Simmons, R. R. Verderber, New thin-film resistive memory, The Radio and Electronic Engineer, Aug. 1967.

Škorić et al., "Robust key extraction from physical uncloneable functions," in Applied Cryptography and Network Security, 2005, pp. 407-422.

Soler, E. Artacho, J. D. Gale, A. García, J. Junquera, P. Ordejón, and D. Sánchez-Portal, The SIESTA method for ab-initio order-N materials simulation J. Phys.: Condens. Matt. 14, 2745-2779 (2002).

Sopinskyy, V. Khomchenko, Electroluminescence in SiOx films and SiOx-film-based systems, Current Opinion in Solid State and Materials Science 7 (2003) 97-109.

Stanford Univsersity, "LIGO Group," <https://lvc.sites.stanford.edu/> publicly available at least as early as Jun. 26, 2020.

Štich, M. C. Payne, R. D. King-Smith, J-S. Lin, and L. J. Clarke Ab initio total-energy calculations for extremely large systems: Application to the Takayanagi reconstruction of Si(111) Phys. Rev. Lett. 68, 1351 (1992).

Strukov, "Endurance-write speed tradeoffs in nonvolatile memories," Applied Physics A, vol. 122, No. 4, pp. 1-4, 2016.

Su et al., "A digital 1.6 pJ/bit chip identification circuit using process variations," IEEE Journal of Solid-State Circuits, vol. 43, No. 1, pp. 69-77, 2008.

Subedi, K. Prasai, D. A. Drabold, "Space-projected conductivity and the spectral properties of the conduction matrix," Physica Status Solidi B, 2020, 2000438.

Subedi, K. Prasai, M. N. Kozicki, and D. A. Drabold, Structural origins of electronic conduction in amorphous copper-doped alumina, Phys. Rev. Materials 3 065605 (2019).

Suh et al., "Physical unclonable functions for device authentication and secret key generation," in Proceedings of the 44th annual Design Automation Conference, 2007, pp. 9-14.

Suzuki, Y. Ishikawa, M. Isshiki, and Y. Waseda, "Native Oxide Layers Formed on the Surface of Ultra High-Purity Iron and Copper Investigated by Angle Resolved XPS," Mater. Trans. JIM, vol. 38, No. 11, pp. 1004-1009, 1997.

Tajik et al., "Physical characterization of arbiter PUFs," in International Workshop on Cryptographic Hardware and Embedded Systems, 2014, pp. 493-509.

Takayanagi, S. Akao, T. Yanagisawa, N. Nakaso, Y. Tsukahara, S. Hagihara, T. Oizumi, N. Takeda, T. Tsuji, K. Yamanaka, Detection of Trace Water Vapor Using SiOx-Coated Ball SAW Sensor, Materials Transactions, vol. 55, No. 7 (2014) pp. 988 to 993, 2014 The Japanese Society for Non-Destructive Inspection.

Thapa, B. Bhattarai, M. N. Kozicki, K. N. Subedi and D. A. Drabold, Structure and charge transport of amorphous Cu-doped tantalum pentoxide: an ab initio study, Phys. Rev. Materials 4 064603 (2020).

Tomozeiu, Electrical conduction and dielectric relaxation of a-SiOx (0bxb2) thin films deposited by reactive RF magnetron sputtering, Thin Solid Films 516 (2008) 8199-8204.

Tsunoda et al., "Low power and high speed switching of Ti-doped NiO ReRAM under the unipolar voltage source of less than 3 V," in IEEE International Electron Devices Meeting (IEDM), 2007, pp. 767-770.

U.S. Appl. No. 17/050,750, filed Oct. 26, 2020, Kozicki et al.
U.S. Appl. No. 17/072,701, filed Oct. 16, 2020, Kozicki.
U.S. Appl. No. 17/100,028, filed Nov. 20, 2020, Kozicki.
U.S. Appl. No. 17/112,668, filed Dec. 4, 2020, Kozicki.

Valov et al., "Electrochemical metallization memories—Fundamentals, applications, prospects," Nanotechnology, vol. 22, p. 254003, 2011.

Valov et al., "Nanobatteries in redox-based resistive switches require extension of memristor theory," Nature Communications, vol. 4, p. 1771, 2013.

Van der Leest et al., "Anti-counterfeiting with hardware intrinsic security," in IEEE Design, Automation & Test in Europe Conference & Exhibition (DATE), 2013, pp. 1137-1142.

van Hapert, Hopping Conduction and Chemical Structure, a study on Silicon Suboxides, PhD Thesis, Universiteit Utrecht, 2012, ISBN 90-393-3063-8.

Vatajelu et al., STT-MRAM-Based PUF Architecture exploiting Magnetic Tunnel Junction Fabrication-Induced Variability; ACM J. Emerging Tech. in Comp Sys.; 13(1):5, May 2016.

Wang, Yang Yang, Jae-Hwang Lee, Vera Abramova, Huilong Fei, Gedeng Ruan, Edwin L. Thomas, James M. Tour, Nanoporous Silicon Oxide Memory, Nano Lett. 2014, 14, 4694-4699.

Waser et al., "Nanoionics-based resistive switching memories," Nature Materials, vol. 6, No. 11, pp. 833-840, 2007.

Waser et al., "Redox-based resistive switching memories-nanoionic mechanisms, prospects, and challenges," Advanced materials, vol. 21, No. 25-26, pp. 2632-2663, 2009.

Webster et al., "On the design of S-boxes," in Advances in Cryptology—Crypto'85 Proceedings, 1985, pp. 523-534.

Willers et al., MEMS-based gyroscope as PUFs; CCS'16, Oct. 24-28, 2016, pp. 591-602.

Wong et al., "Memory leads the way to better computing," Nature Nanotechnology, vol. 10, No. 3, pp. 191-194, 2015.

Yang et al., Adaptive Quantization Using Piecewise Companding and Scaling for Gaussian Mixture; Visual Communication and Image Representation. 2012.

Yang, Y. et al., "Novel Complementary Resistive Switch Crossbar Memory Write and Read Schemes", IEEE Transactions on Nanotechnology, Mar. 2015 [IEEE Date of Publication: Jan. 2015], vol. 14, No. 2, pp. 346-357 <DOI:10.1109/TNANO.2015.2394450>.

Yasser Alajerami, David Drabold, Mohamed Mhareb, Katherine Lesslee, Gang Chen, and Kashi Subedi, Physical, Structural and Shielding properties of Cadmium Bismuth Borate-Based glasses, J. App. Physics 127 175102 (2020).

Yoshida, I. Umezu, N. Sakamoto, M. Inada, A. Sugimura, Effect of structure on radiative recombination processes in amorphous silicon suboxide prepared by rf sputtering, J. Appl. Phys. 92, 5936 (2002).

Yu et al., "Secure and robust error correction for physical unclonable functions," IEEE Design Test of Computers, vol. 27, No. 1, pp. 48-65, 2010.

Zhang and D. A. Drabold, Alternative approach to computing transport coefficients: application to conductivity and Hall coefficient of hydrogenated amorphous silicon, Phys. Rev. Lett. 105 186602 (2010).

Zhang and D. A. Drabold, Electrical conductivity calculations: the role of degenerate and resonant electron states, Phys. Rev. B 81 085210 (2010).

Zhang and D. A. Drabold, Structural and electronic properties of glassy GeSe2 surfaces, Phys. Rev. B 62 15695 (2000).

Zhang and D. A. Drabold, The work done by an external electromagnetic field, J. Phys. Cond. Matter 23 085801 (2011).

Zhang and D. A. Drabold, Transport calculations in complex materials: a comparison of the Kubo formula, the Kubo-Greenwood formula and the microscopic response method, Phys Rev E 83 012103 (2011).

Zhang et al., "A PUF-FSM binding scheme for FPGA IP protection and pay-per-device licensing," IEEE Transactions on Information Forensics and Security, vol. 10, No. 6, pp. 1137-1150, 2015.

Zhang et al., "Exploiting process variations and programming sensitivity of phase change memory for reconfigurable physical unclonable functions," IEEE Transactions on Information Forensics and Security, vol. 9, No. 6, pp. 921-932, 2014.

Zhang et al., "Optimizating emerging nonvolatile memories for dual-mode applications: Data storage and key generator," IEEE Transactions on Computer-Aided Design of Integrated Circuits and Systems, vol. 34, No. 7, pp. 1176-1187, 2015.

Zhang et al.,, "Highly reliable spin-transfer torque magnetic rambased physical unclonable function with multi-response-bits per cell," IEEE Transactions on Information Forensics and Security, vol. 10, No. 8, pp. 1630-1642, 2015.

Zheng, C. N. Xu, E. Tanaka, Y. Tomokiyo, M. Suzuki, and E. S. Otabe, "Charge-spin-orbital coupling in CuO," Phys. C Supercond., vol. 357-360, pp. 181-185, 2001.

(56) References Cited

OTHER PUBLICATIONS

Zhou, Tao Du, Lijie Guo, Morten M. Smedskjaer, Mathieu Bauchy, New insights into the structure of sodium silicate glasses by force-enhanced atomic refinement, J. Non. Cryst. Sol. 536 120006 (2020).

International Search Report and Written Opinion for Application No. PCT/US2021/030157 dated Sep. 22, 2021 (16 pages).

* cited by examiner

PROGRAMMABLE INTERPOSERS FOR ELECTRICALLY CONNECTING INTEGRATED CIRCUITS

CROSS-REFERENCE TO RELATED APPLICATIONS

This application is a non-provisional of and claims benefit of U.S. Provisional Application No. 62/903,399, filed on Sep. 20, 2019, the entire contents of which are incorporated herein by reference.

BACKGROUND

Interposers are now used extensively in the semiconductor industry to provide connections between silicon integrated circuits (ICs) and certain types of packages (e.g., a ball grid array (BGA)), and to provide connections between multiple ICs within the same package to create a system-in-package (SiP) design. Interposers can be made from silicon, glass, or organic materials and typically contain fast (low delay) and wide signal conduits and low resistance/low inductance power routing, both of which lead to higher energy efficiency and system design flexibility. Advanced interposers not only contain multiple layers of wiring but can also have integrated passive devices (IPDs), such as resistors, capacitors, or inductors, and through-silicon vias (TSVs), which are electrical connections though the interposer that allow ICs to be placed and interconnected on both sides of an interposer substrate. Interposers are usually fabricated using silicon IC manufacturing equipment in a back-end-of-line (BEOL) fabrication plant using relaxed geometries (e.g., 1 to 8 microns (µm) linewidth) to minimize cost while maximizing performance, although sub-micron linewidth options are currently in development.

SUMMARY

The present disclosure provides a programmable interposer for electrically connecting integrated circuits. In one implementation, the programmable interposer includes an interposer substrate and a programmable metallization cell (PMC) switch. The PMC switch is formed on the interposer substrate and is coupled between a signal input and a signal output. The PMC switch is electrically configurable between a high resistance state and a low resistance state.

The present disclosure also provides a method for programming a programmable interposer for electrically connecting integrated circuits. The programmable interposer includes an interposer substrate and a PMC. The PMC switch is formed on the interposer substrate and is coupled between a signal input and a signal output. The method includes electrically configuring the PMC switch in a low resistance state. The method further includes electrically configuring the PMC switch in a high resistance state.

The present disclosure further provides an integrated circuit packaging including a programmable interposer. In one implementation, the programmable interposer includes an interposer substrate and a PMC switch. The PMC switch is formed on the interposer substrate and is coupled between a signal input and a signal output. The PMC switch is electrically configurable between a high resistance state and a low resistance state.

Those skilled in the art will appreciate the scope of the present disclosure and realize additional aspects thereof after reading the following detailed description of the preferred implementations in association with the accompanying drawing figures.

BRIEF DESCRIPTION OF THE DRAWINGS

The accompanying drawing figures incorporated in and forming a part of this specification illustrate several aspects of the disclosure, and together with the description serve to explain the principles of the disclosure.

DETAILED DESCRIPTION

Figure 1:
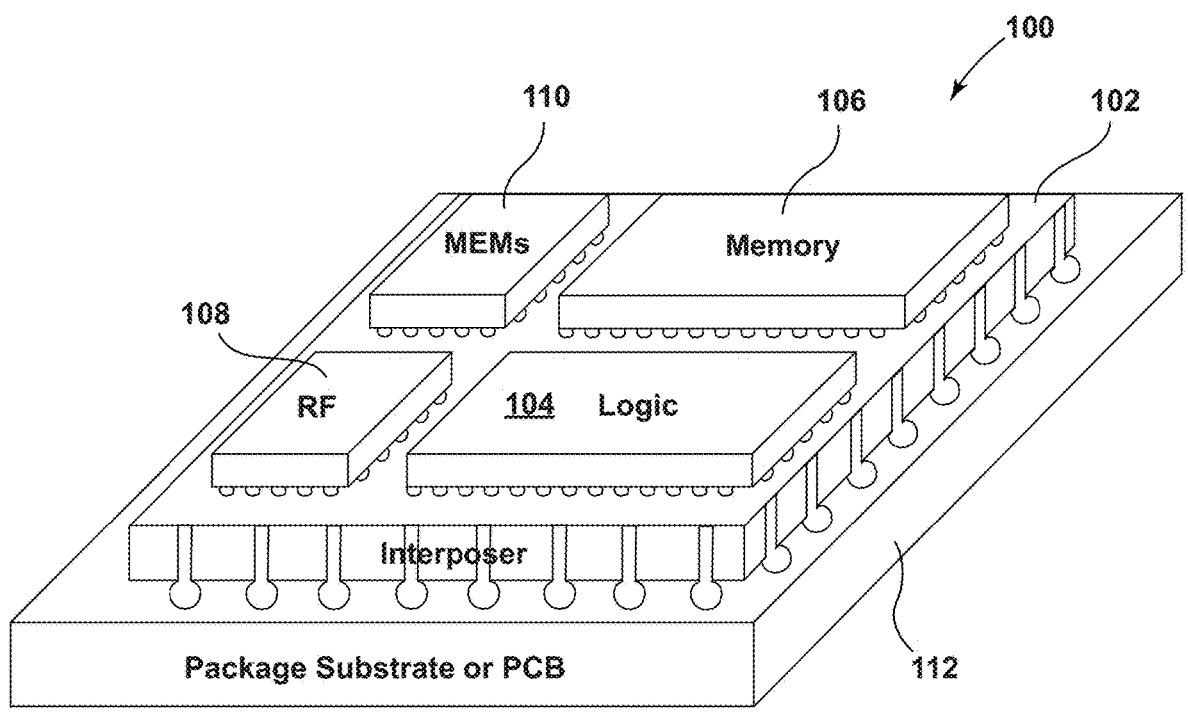
FIG. 1 is a schematic diagram of one example of an integrated circuit (IC) packaging which includes a programmable interposer.

The implementations set forth below represent the necessary information to enable those skilled in the art to practice the implementations and illustrate the best mode of practicing the implementations. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular implementations only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Programmable interposers for integrated circuit (IC) packaging are provided. A programmable interposer, also referred to herein as a smart interposer, can be reconfigured electrically to allow custom system-in-package (SiP) operation and configuration, field configurability, and functional obfuscation in the case of secure ICs fabricated on non-trusted environments. In some implementations, programmable metallization cell (PMC) switches are fabricated on the programmable interposer, so that the programmable interposer can be configured electrically after fabrication and even after the completion of SiP assembly. In some implementations, the PMC switches are based on a copper-silicon oxide (Cu—SiO$_x$) material system. In other implementations, the PMC switches can be based on another oxide electrolyte, such as copper-tungsten oxide (Cu—WO$_3$).

FIG. 1 is a schematic diagram of one example of an integrated circuit packaging 100 which includes a programmable interposer 102. The integrated circuit packaging 100 illustrated in FIG. 1 is a SiP assembly and further includes a plurality of IC components. The plurality of IC components illustrated in FIG. 1 includes a logic component 104 (e.g., a processing device), a memory 106, a radio-frequency (RF) component 108, and a micro-electrical-mechanical systems (MEMS) component 110. In other implementations, the plurality of IC component includes other IC components or other combinations of IC components. The plurality of IC components are interconnected on the programmable interposer 102. The programmable interposer 102 mates with a circuit assembly 112 (for example, a packaging substrate or a printed circuit board [PCB]).

In some implementations, the plurality of IC components are produced on separate production lines that have been optimized for different chip technologies. The programmable interposer 102 includes chip-to-interposer connections and interposer-to-assembly connections, which may be via bumps or micro-bumps consisting of low melting point metals or alloys that liquefy when exposed to moderate temperatures (e.g., mid-200° C. range) and refreeze to form electrical and mechanical couplings.

Manufacturing costs can be reduced by manufacturing interposers with standard elements, such as arrays of through-silicon vias (TSVs), which are used with wiring schemes that are specific to a particular system design. The design of interposer wiring is traditionally performed using standard design tools. A system built on such an interposer can therefore comprise standard or custom ICs (or a combination of both) yet be endowed with custom functionality by the manner in which the interposer connects the IC components to each other, to a power grid, and to passive components on the interposer.

The programmable interposer 102 takes such customization further by having one of more PMC switches fabricated on the interposer, so that the programmable interposer 102 can be configured electrically after fabrication and even after completion of the SiP assembly. In some implementations, the PMC switches are based on a copper-silicon oxide material system (Cu—SiO$_x$, where x<2). One advantage of the material system is that the PMC switches are copper (Cu)-based, which is the same as the metallization used in traditional interposers. Another advantage of the material system is compatibility with existing tools and processes as used in interposer fabrication. A further advantage of the material system is low temperature (<200° C.) deposition so that various interposer materials can be used, including organic substrates. Another advantage of the material system is low voltage and low current operation so that existing power rails can be used without charge pumps. A further advantage of the material system is a highly stable on state, which can be used to control signal and power routing.

It should be understood that other oxide-electrolyte material systems, such as copper-tungsten oxide (Cu—WO$_3$), may also be used and have similar advantages. An example of an oxide-electrolyte-based PMC element for a PMC switch is further illustrated with respect to FIGS. 2A and 2B.

Figure 2A:
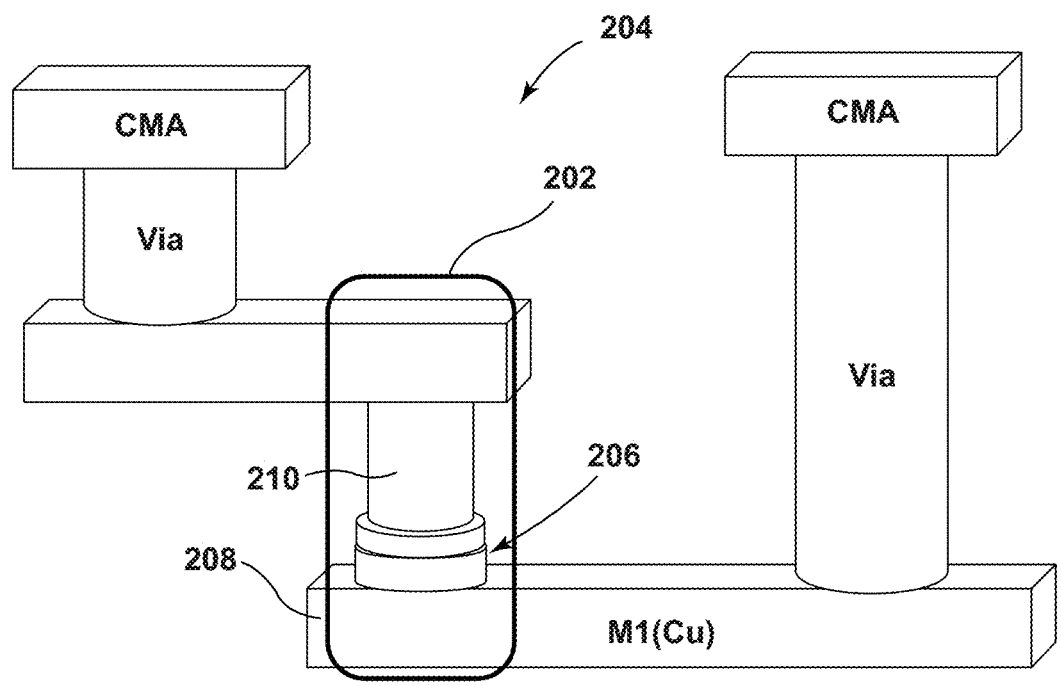
FIG. 2A is a schematic diagram of one example of a programmable metallization cell (PMC) element for a PMC switch.

FIG. 2A is a schematic diagram of one example of a PMC element 202 for a PMC switch 204. The PMC element 202 can be foundry-fabricated in an insulating material (e.g., an interposer substrate or another insulating material coupled to the interposer substrate) using an appropriate material for an ion conductor 206, such as SiO$_x$. Switching the PMC element 202 from a high-resistance (off) state to a low-resistance (on) state occurs by the formation of an oxidizable electrode 208 (e.g., a copper filament) which bridges the ion conductor 206 upon application of a switching threshold voltage $V_{th}$, which may be a small voltage (e.g., +0.6 V on the copper filament) relative to an adjacent indifferent electrode 210 (e.g., a tungsten electrode, which may be grounded). A reverse bias (e.g., of −0.8 V) returns the device to its high resistance state by dissolving the bridge formed by the oxidizable electrode 208. In some implementations, one such PMC element 202 forms the PMC switch 204. In other implementations (discussed further below) multiple PMC elements are used to form a PMC switch. For example, the PMC switch may include a plurality of PMC elements connected in a parallel configuration between a signal input and a signal output. Using a PMC switch with a plurality of PMC elements connected in a parallel configuration lowers the resistance of each PMC element.

In this regard, the oxidizable electrode 208 is formed of a material including a metal that dissolves in the ion conductor 206 when a sufficient bias (e.g., the switching threshold voltage $V_{th}$) is applied across the oxidizable electrode 208 and the indifferent electrode 210. The indifferent electrode 210 is relatively inert and does not dissolve during operation of the PMC element 202. For example, the oxidizable electrode 208 may be an anode during a write process and be comprised of a material including copper that dissolves in the ion conductor, and the indifferent electrode 210 may be a cathode during the write process and include an inert material such as tungsten, nickel, molybdenum, platinum, metal silicides, noble metals, including platinum, ruthenium, iridium, and metal nitrides, including tungsten nitride, titanium nitride, and the like.

Having the oxidizable electrode 208 which dissolves in the ion conductor 206 facilitates maintaining a desired dissolved metal concentration within the ion conductor 206, which in turn facilitates rapid and stable formation of a programmed region within the ion conductor 206 or other electrical property change during use of the PMC element 202. Furthermore, use of an inert material for the indifferent electrode 210 (cathode during a write operation) facilitates electro-dissolution of any programmed region that may have formed and/or return of the PMC element 202 to an erased state after application of a sufficient reverse bias voltage.

During an erase operation, dissolution of a programmed region that may have formed in the ion conductor 206 preferably begins at or near the oxidizable electrode/programmed region interface. Initial dissolution of the programmed region at the oxidizable electrode/programmed region interface may be facilitated by forming the PMC element 202 such that the resistance at the oxidizable electrode/programmed region interface is greater than the resistance at any other point along the programmed region, particularly, the interface between the programmed region and the indifferent electrode 210.

One way to achieve relatively low resistance at the indifferent electrode 210 is to form the indifferent electrode 210 of relatively inert, non-oxidizing material such as platinum. Use of such material reduces formation of oxides at the interface between the ion conductor 206 and the indifferent electrode 210 as well as the formation of compounds or mixtures of the indifferent electrode material and ion conductor material, which typically have a higher resistance than the ion conductor 206 or the indifferent electrode 210.

Relatively low resistance at the indifferent electrode 210 may also be obtained by forming a barrier layer between the oxidizable electrode 208 (anode during a write operation) and the ion conductor 206, wherein the barrier layer is formed of a material having a relatively high resistance. For example, the barrier layer may include ion conductors (such as silver oxide ($Ag_xO$), silver sulfide ($Ag_xS$), silver selenide ($Ag_xSe$), silver telluride ($Ag_xTe$), where x≥2 silver iodide ($Ag_y1$), where y≥1, copper iodide ($CuI_2$), copper oxide (CuO), copper sulfide (CuS), copper selenide (CuSe), copper telluride (CuTe), germanium oxide ($GeO_2$), germanium sulfide ($Ge_zS_{1-z}$), germanium selenide ($Ge_zSe_{1-z}$), germanium tritiide ($Ge_zT_{1-z}$), arsenic sulfide ($As_zS_{1-z}$), arsenic selenide ($As_zSe_{1-z}$), arsenic telluride ($As_zTe_{1-z}$), where z is greater than or equal to about 0.1, and combinations of these materials) interposed between the ion conductor 206 and a metal layer such as silver. The insulating material suitably includes material that prevents undesired diffusion of electrons and/or ions from the PMC element. In some implementations, the insulating material includes silicon nitride, silicon oxynitride, polymeric materials such as polyimide or parylene, or any combination thereof.

Figure 2B:
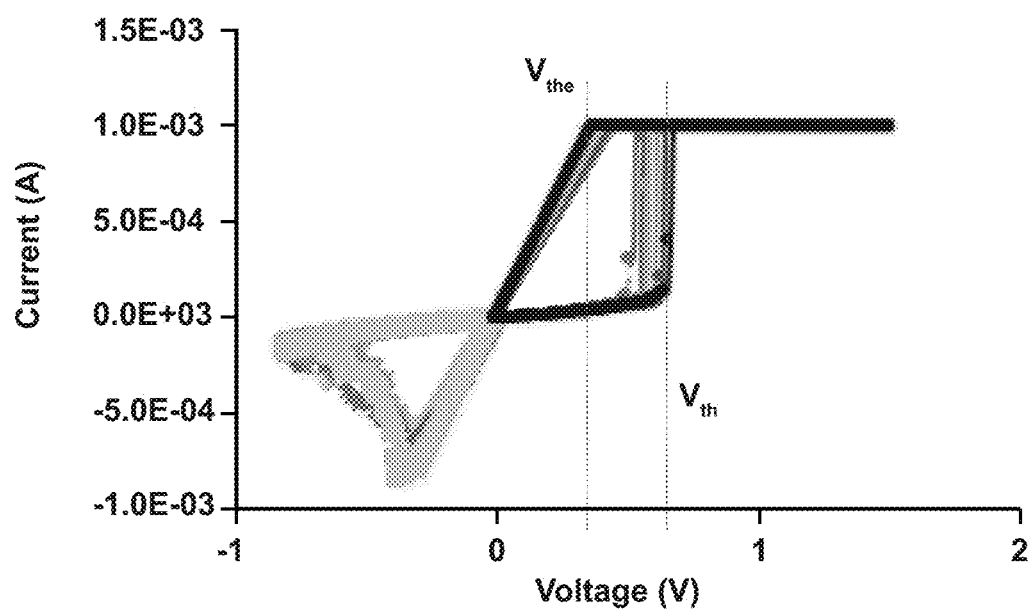
FIG. 2B is a current-voltage (I/V) plot of several write-erase cycles of the PMC switch of FIG. 2A.

FIG. 2B is a current-voltage (I/V) plot of several write-erase cycles of the PMC element 202 of FIG. 2A. The I/V plot illustrates the effect of switching the PMC element 202 between on and off states by showing several write-erase cycles (switching from off to on, then back to off) with a current limit of 1 mA, which leads to an on-state resistance in the order of 300Ω in this example.

By using one or more of these PMC elements to control how ICs and/or circuit elements connected to the programmable interposer (e.g., smart interposer) of FIG. 1 are connected, various configurations are possible. For example, a signal line from one IC to another can be physically interrupted by the PMC element 202, which would essentially act as an anti-fuse (e.g., having no connection between the ICs in the off state while connecting the ICs in the on state). However, in this configuration, an off-state element could be unintentionally switched on by voltages that appear on the signal lines. For example, if a first signal line connected to a copper filament were high (logic 1) while a second signal line connected to a tungsten electrode is low (logic 0), the PMC element could switch from its high resistance (off) to its low resistance (on) state. This could be prevented by ensuring that the device switching threshold voltage $V_{th}$ is in excess of the voltage differential (for example, setting $V_{th} > V_{dd}$-ground, for a worst case). Alternatively, a three-terminal arrangement could be used, as described with respect to FIG. 3A.

Figure 3A:
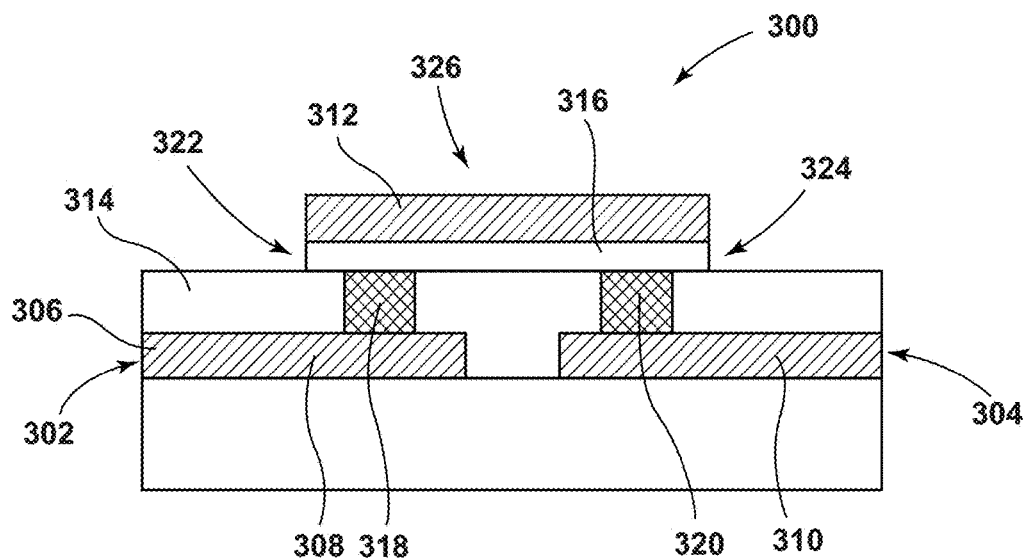
FIG. 3A is a schematic diagram of one example of a three-terminal PMC switch.

FIG. 3A is a schematic diagram of one example of a three-terminal PMC switch 300. In the three-terminal PMC switch 300, a signal (or power) is carried from a transmitting end 302 (an example of a "signal input") to a receiving end 304 (an example of a "signal output") in a first copper interconnect layer 306. The first copper interconnect layer 306 includes a first copper electrode 308 and a second copper electrode 310, which are discontinuous such that the transmitting end 302 and the receiving end 304 are not connected when the three-terminal PMC switch 300 is not being programmed. The first copper interconnect layer 306 is separated from a second copper interconnect layer 312 by an inter-layer dielectric material 314 (e.g., silicon dioxide ($SiO_2$), silicon nitride ($Si_3N_4$), organic films, etc.) (one example of an "insulating material"). The second copper interconnect layer 312 (one example of an "oxidizable electrode") is further separated from the first copper interconnect layer 306 by an ion conductor 316.

A first tungsten plug 318 and a second tungsten plug 320 are formed in vias in the inter-layer dielectric material 314, rising from the first copper interconnect layer 306 to form cathodes of a first PMC element 322 and a second PMC element 324. The first tungsten plug 318 and the second tungsten plug 320 are examples of indifferent electrodes. A section of the second copper interconnect layer 312 forms a common copper anode for both the first PMC element 322 and the second PMC element 324, such that the PMC elements 322 and 324 are arranged in a back-to-back configuration. This ensures that a voltage differential from the transmitting end 302 to the receiving end 304 (with connection 326 at the second copper interconnect layer 312 floating) will not switch this two-element configuration into a conducting/low resistance state, as one of the PMC elements (e.g., the first PMC element 322) will always be reverse biased (e.g., +$V_{dd}$ on the first tungsten plug 318 and ground on the first copper electrode 308), and therefore will be unable to switch to its low resistance state. At the same time, the other PMC element (e.g., the second PMC element 324), even though forward biased, will have insufficient bias across it to switch to its low resistance state due to the voltage drop across the reverse biased element, such that the three-terminal PMC switch 300 will not spontaneously switch in normal operation.

Figure 3B:
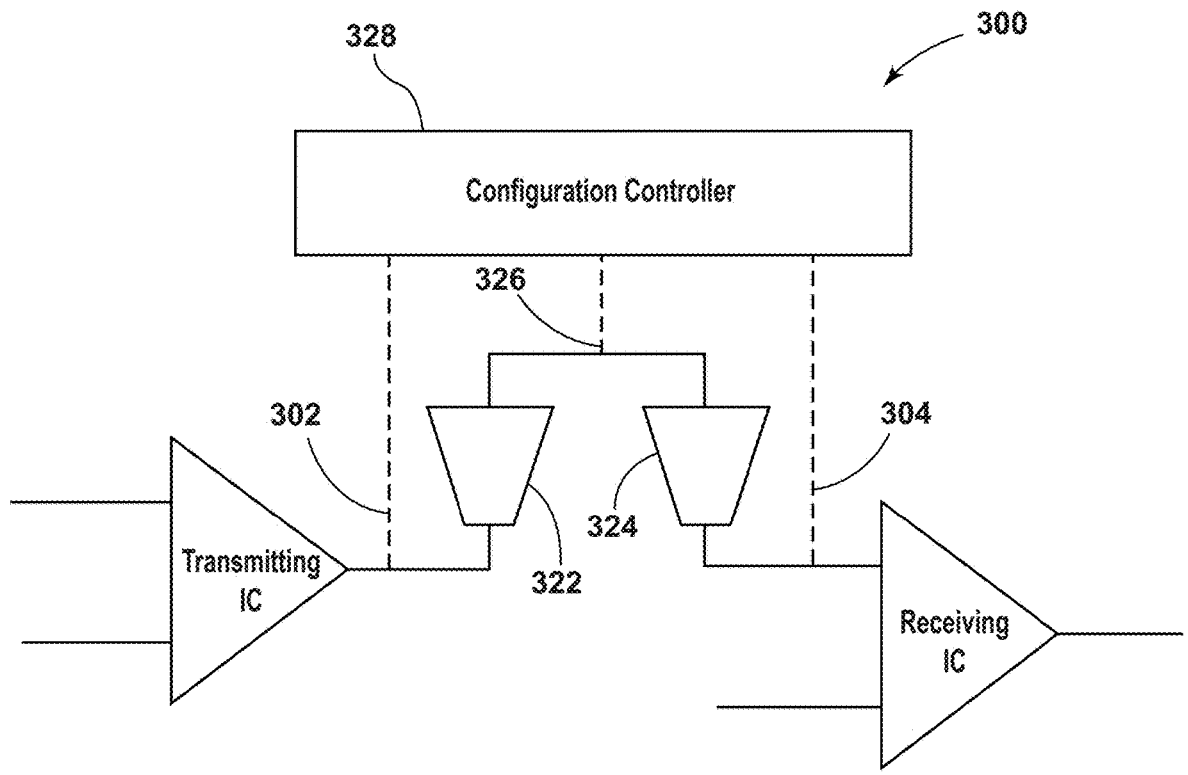
FIG. 3B is a circuit schematic of one example of the three-terminal PMC switch of FIG. 3A with a configuration controller.

FIG. 3B is a circuit schematic of the three-terminal PMC switch 300 of FIG. 3A with a configuration controller 328. With reference to FIGS. 3A and 3B, a voltage is applied to the common anode (e.g., a section of the second copper interconnect layer 312) through the connection 326 from the configuration controller 328 to bridge the discontinuity in the first copper interconnect layer 306 of the three-terminal PMC switch 300. The configuration controller 328 may be a separate IC on the interposer or an external system connected to the interposer through package pins, while the transmitting end 302 and the receiving end 304 are grounded, either simultaneously or sequentially. This will switch both PMC elements 322 and 324 into the low resistance state.

An on-state resistance $R_{on}$ of the three-terminal PMC switch 300 is a function of a programming current $I_{prog}$ given by the relationship:

$$R_{on} = V_{the}/I_{prog}$$

where $V_{the}$ is a threshold voltage for the continued formation of the conducting filament after it has been initiated, around 0.2 to 0.3 V for the Cu—SiO$_x$ system (as noted above with respect to FIG. 2B). This means that a programming current of 1 mA will result in a 300-ohm on-state, as is the case in the PMC element of FIG. 2, and a 5 mA programming current will ensure that both on-state elements in series will have a combined resistance in the order of 100-ohm.

The configuration controller 328 is capable of supplying such programming currents during programming; if the programming of the PMC elements 322 and 324 is performed simultaneously rather than sequentially, then the current supplied by the control circuit through connection 326 will be twice the amount for a single PMC element. Note that when the three-terminal PMC switch 300 is not being programmed, the transmitting end 302, the receiving end 304, and connection 326 would be floating so as not to interfere with the operation of the system (as further described below). When both PMC elements 322 and 324 are in their low resistance state, the voltage drop across both will be insufficient to switch the reverse biased device to its high resistance state under any circumstances, so the configuration will be stable in this on-state.

The above mode of operation is called "hard programming," as it creates a final circuit/system configuration that will not be changed for the life of the part. However, it might also be desirable in some cases to have a "soft programming" function, to allow testing of multiple configurations prior to the final circuit commitment, or to possibly allow system reconfiguration in the field. In this case, the programming current $I_{prog}$ would be lower, in the order of a few hundred µA, resulting in a higher on-state resistance (several kΩ) which can be easily erased by applying a reverse bias to the PMC elements from the control circuit, and re-programmed again (e.g., several hundred times) if desired. In some cases, this would only be applicable to signal routing as the higher resistance in the interconnect pathway would create too much voltage drop for power routing applications. Even in the signal routing case, there will be a time delay due to the presence of the high resistance elements in the signal path, so the soft programming mode may not be used in high frequency applications or high-speed system testing.

Figure 3C:
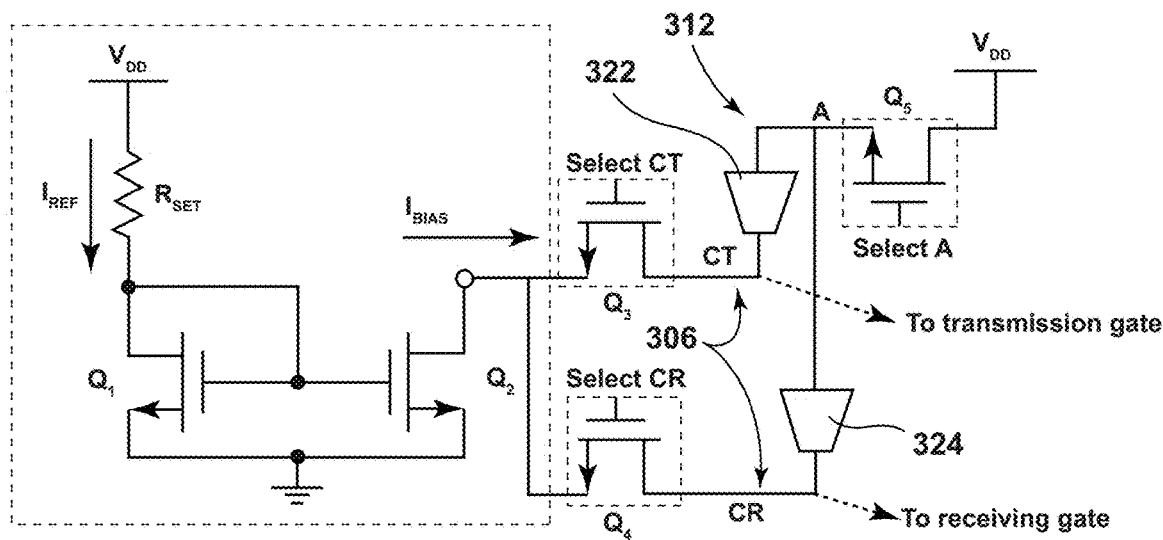
FIG. 3C is a circuit schematic of one example of control and configuration components for the three-terminal PMC switch of FIG. 3A.

FIG. 3C is a circuit schematic for control and/or configuration of the three-terminal PMC switch 300 of FIG. 3A. In this, the reference current is set by the value of $R_{set}$ in a constant current source (shown in a box on the left), and this determines the bias current (e.g., programming current $I_{prog}$) that flows through a selected PMC element. Pass transistors $Q_3$, $Q_4$, and $Q_5$ allow this current to flow through the selected PMC element. These transistors are designed so that their on resistance is low (e.g., their width to length ratio is relatively large), but with high off resistance that allows the PMC elements to float when they are not being programmed.

To select a PMC element to program, the pass transistors at both ends of the element must be turned on. To program the first PMC element 322 on the transmission gate side of the break in the first copper interconnect layer 306, pass transistors $Q_3$ and $Q_5$ would be turned on, while programming of the second PMC element 324 on the receiving gate side would be accomplished by turning on pass transistors $Q_4$ and $Q_5$. In the programmable interposer (e.g., smart interposer) of FIG. 1, each three-terminal PMC switch would have its own set of three pass transistors, which may all be fed from the same current source or from separate current sources. These pass transistors could be integrated with the current source(s) on a separate control IC that is part of the SiP design or the control IC could reside off-package if the programmable interposer was only to be programmed using an external programmer. Note that in the case of an external system programmer, it is also possible to use relays rather than pass transistors as long as the three-terminal PMC switch density is not too high (e.g., programmable interposer is limited to a few hundred three-terminal PMC switches). In the case of very large numbers of three-terminal PMC switches in the programmable interposer (e.g., several thousand and greater), multiple control ICs and multiplexed lines may be necessary to reduce the number of control lines on the programmable interposer.

Figure 3D:
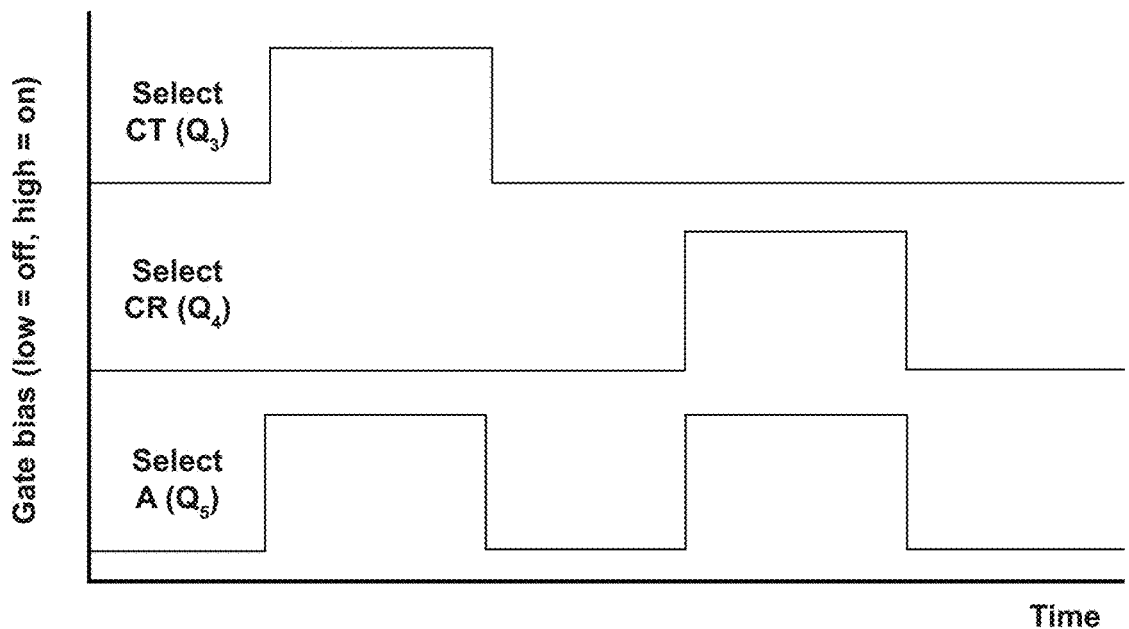
FIG. 3D is a select transistor timing diagram for one example of sequential programming of PMC elements in the three-terminal PMC switch of FIG. 3C.
Figure 3E:
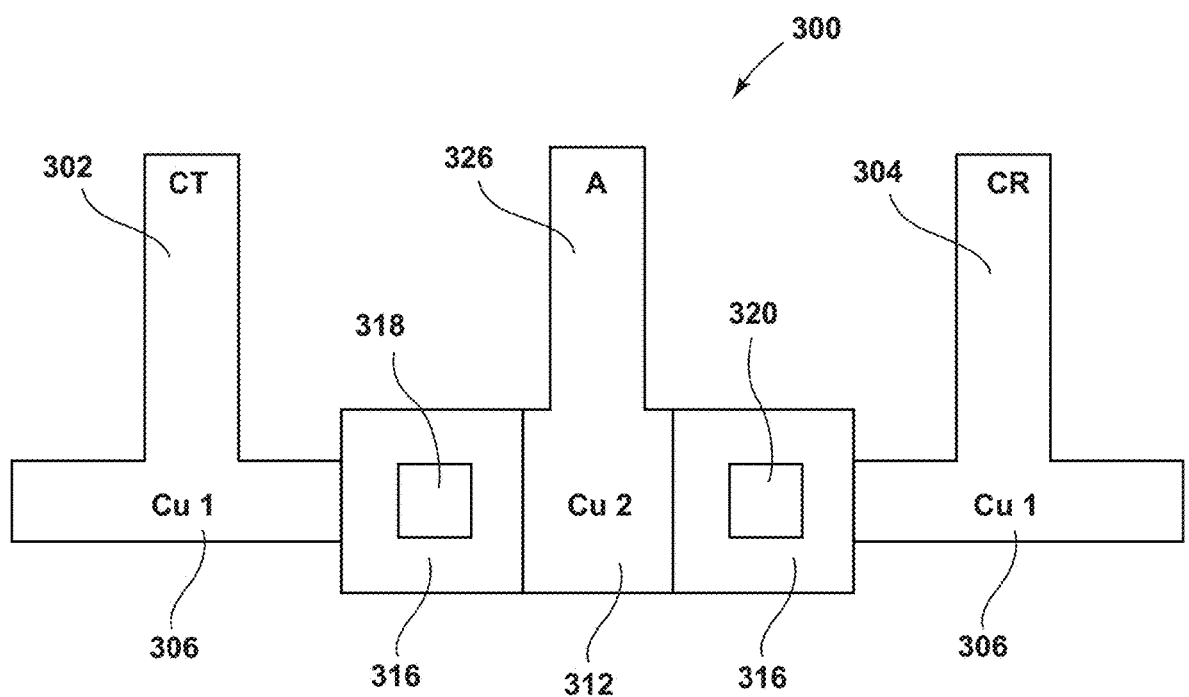
FIG. 3E is a plan view of the three-terminal PMC switch of FIG. 3A.

FIG. 3D is one example of a pass transistor timing diagram for sequential programming of PMC elements in the three-terminal PMC switch 300 of FIG. 3C. In this example, the "T" side element is programmed first ($Q_3$ and $Q_5$ are on, $Q_4$ is off), and then the "R" side element is programmed ($Q_4$ and $Q_5$ are on, $Q_3$ is off). The pass transistors are on for a time that is sufficient for the PMC element to reach its stable low resistance configuration (e.g., 1 millisecond (ms)). Note that if the elements were to be programmed simultaneously, the current source would have to produce twice the current required for each element. This would bring the three-terminal PMC switch 300 to around 100-ohm, requiring at least 5 mA per element, which would equate to 10 mA for simultaneous programming. While this may be acceptable in some cases, it does require wider and/or thicker metallization on the common programming line (A), which will reduce the density of the programming interconnect. FIG. 3E is a plan view of the three-terminal PMC switch 300 of FIG. 3A.

Figure 4A:
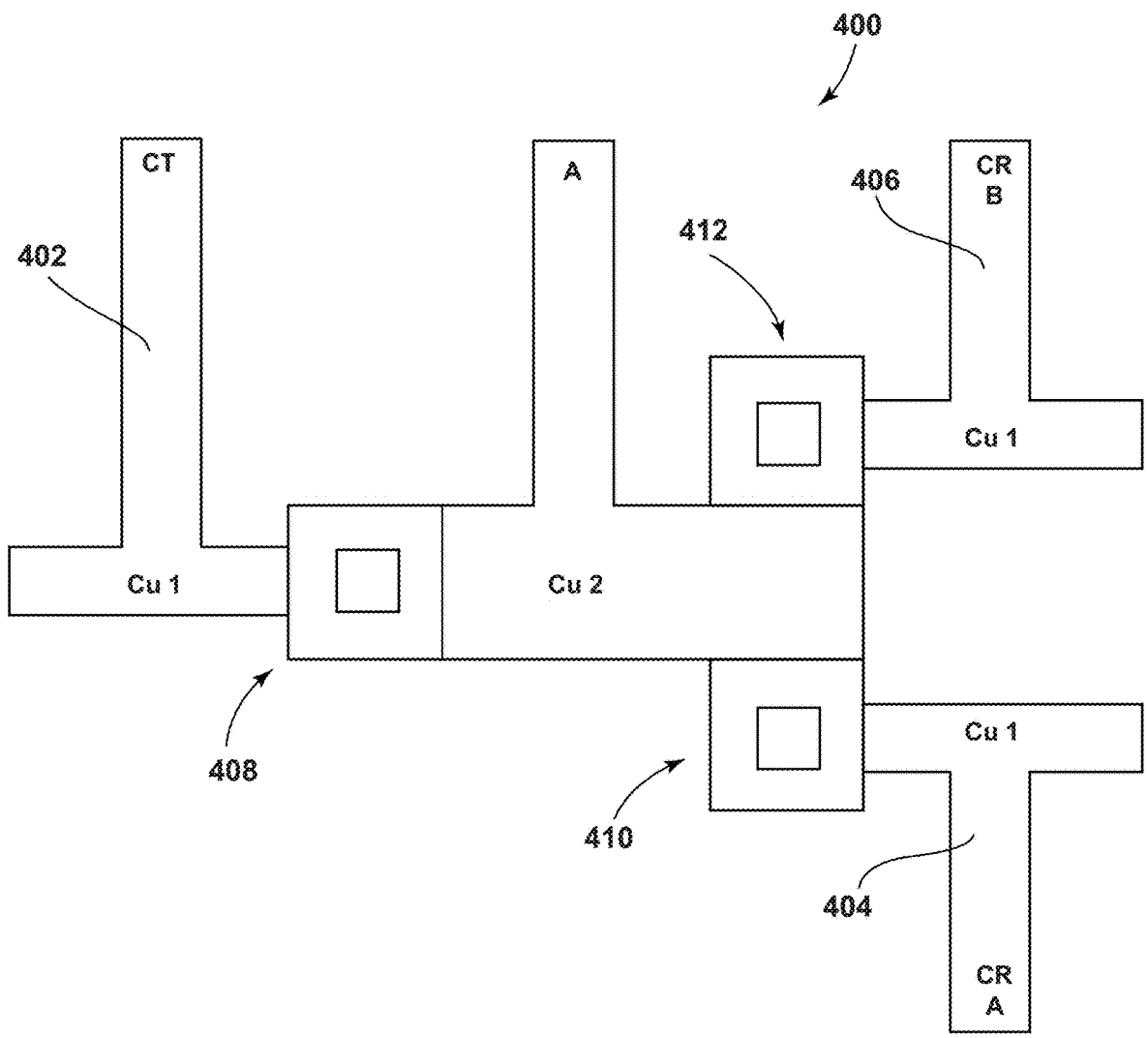
FIG. 4A is a plan view of one example of a four-terminal PMC switch having one input and two outputs.
Figure 4B:
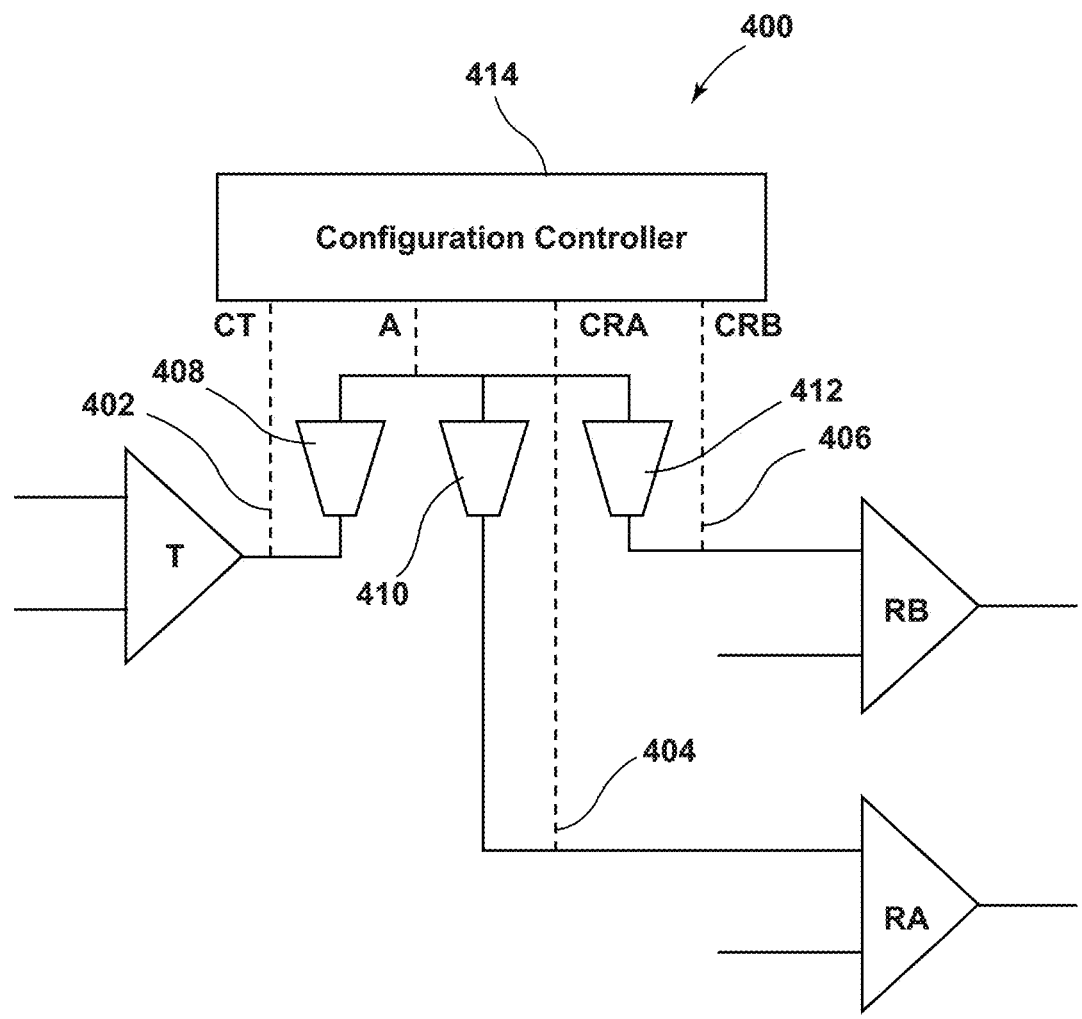
FIG. 4B is a circuit schematic of the four-terminal PMC switch of FIG. 4A.

FIG. 4A is a plan view of one example of a four-terminal PMC switch 400 having one input and two outputs. FIG. 4B is a circuit schematic of the four-terminal PMC switch 400 of FIG. 4A. The four-terminal PMC switch 400 includes a signal input 402, a first signal output 404, a second signal output 406, a first PMC element 408, a second PWC element, 410, a third PMC element 412, and a configuration controller 414. A major advantage of having a switching device comprised of individual PMC elements is that more elements can be added to create devices that not only switch a single interconnect line but also can switch between lines. For example, in the four-terminal PMC switch 400, the signal (or power) can be routed from the signal input 402 to either the first signal output 404, the second signal output 406, or both, by turning on the appropriate PMC elements via bias applied by the configuration controller 414. It should be understood that other examples can have additional signal outputs, multiple inputs to a single signal output, and other configurations in a similar manner as described above.

Figure 5:
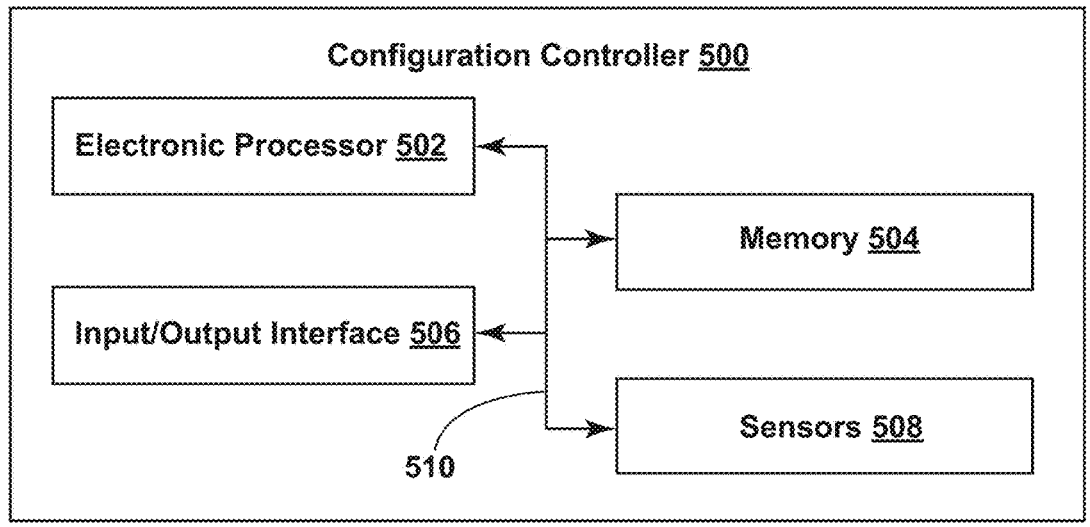
FIG. 5 is a block diagram of one example of a configuration controller.

FIG. 5 is a block diagram of one example of a configuration controller 500. The configuration controller 500 illustrated in FIG. 5 includes an electronic processor 502 (for example, one or more microprocessors, ASICs, SoCs, or other electronic controllers), memory 504, an input/output interface 506, sensors 508, and a bus 510. The bus 510 connects various components of the configuration controller 328 including, for example, the memory 504 to the electronic processor 502. The memory 504 includes read only memory (ROM), random access memory (RAM), an electrically erasable programmable read-only memory (EEPROM), other non-transitory computer-readable media, or a combination thereof. The electronic processor 502, in one implementation, is configured to retrieve program instructions and data from the memory 504 and execute, among other things, instructions to perform the methods described herein. Alternatively, or in addition to, the memory 504 is included in the electronic processor 502. The input/output interface 506 includes routines for transferring information between components within the configuration controller 500 and components external to the configuration controller 500. The input/output interface 506 is configured to transmit and receive signals via wires, fiber, wirelessly, or a combination thereof. Signals may include, for example, control signals, information, data, serial data, data packets, analog signals, or a combination thereof. The sensors 508 detect electrical characteristics of the programmable interposer 102. For example, the sensors 508 measure voltage and/or current values at various nodes and junctions of the programmable interposer 102.

Figure 6:
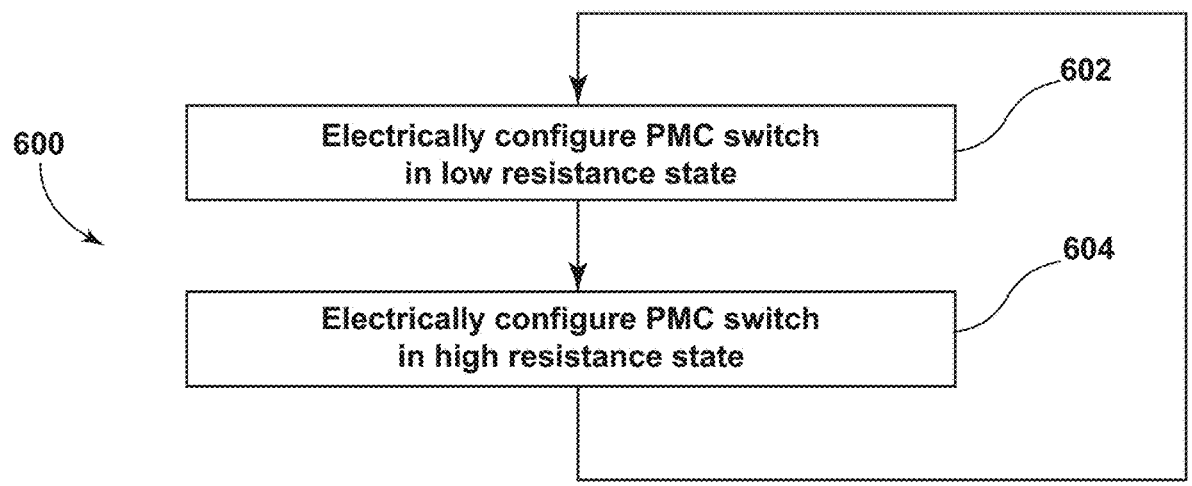
FIG. 6 is a flow diagram of one example of a method for programming a programmable interposer for electrically connecting integrated circuits.

FIG. 6 is a flow diagram of one example of a method 600 for programming the programmable interposer 102 for electrical connecting integrated circuits. For illustrative purposes, the method 600 is described in relation to the PMC switch 204 illustrated in FIG. 2A. At block 602, the PMC switch 204 is electrically configured in the low resistance state. In some implementations, a switching threshold voltage is applied to the PMC switch 204 (for example, by the configuration controller 500). At block 604, the PMC switch 204 is electrically configured in the high resistance state. In some implementations, a reverse bias voltage is applied to the PMC switch 204 (for example, by the configuration controller 500).

The programmable interposers described herein provides several advantages over traditional interposers. One advantage is the customization of system function. Even using the same chipset, the programmable interposers described herein enable customization of functionality by configuring the routing of, for example, data (and address) buses, enables/hard interrupts, power lines, and integrated passive devices (IPDs), such as resistors, capacitors, or inductors, and TSVs—not only in/out configurations, but also trimming by connecting different passive devices. The programmable interposers described herein also enable ultra-custom/one-off systems to be constructed, which would be prohibitively expensive in hard-design approaches.

Another advantage is field configurability. The programmable interposers described herein are programmed during system assembly, but electrical configurability means that the final system configuration may be achieved during the final test of the completed SiP or even in the field by the end user. This would allow the customer to set functionality based on a particular use circumstance or to provide just-in-time updated versions of the configuration.

Another advantage is reconfigurability. A reversal of bias can erase a programmed PMC element to allow it to be later reprogrammed if desired. This ability to be cycled allows configurations to be changed, either during testing in the factory or by the user in the field, e.g., to provide functional updates. In general, soft programmed devices are capable of handling more write-erase cycles than hard programmed devices (e.g., over 1,000 cycles for soft programmed devices, less than 100 cycles for hard programmed devices), but the on state resistance of soft programmed devices is relatively high and so will limit system testing to "slow" modes of operation.

A further advantage is functional obfuscation. Secure systems often comprise ICs fabricated in non-trusted environments. To build a secure system with these ICs, the final system configuration (including signal, power, and passive device connections) should be conferred in a trusted facility so that the true (and perhaps secret) functionality of the system only emerges at the point of programmable interposer programming.

Those skilled in the art will recognize improvements and modifications to the preferred implementations of the present disclosure. All such improvements and modifications are considered within the scope of the concepts disclosed herein and the claims that follow.

What is claimed is:

1. A programmable interposer for electrically connecting integrated circuits, the programmable interposer comprising:
   an interposer substrate; and
   a programmable metallization cell (PMC) switch formed on the interposer substrate and coupled between a first signal input and a first signal output, wherein the PMC switch is electrically configurable between a high resistance state and a low resistance state,
   wherein the PMC switch is a four-terminal PMC switch coupled between the first signal input, the first signal output, and a second signal output and electrically configurable to set one or both of the first signal output and the second signal output in the low resistance state.

2. The programmable interposer of claim 1, further comprising a configuration controller coupled to the PMC switch and configured to set the PMC switch in the low resistance state or the high resistance state.

3. The programmable interposer of claim 2, wherein the PMC switch is a first PMC switch, wherein the programmable interposer further comprising a second PMC switch, wherein the configuration controller is further configured to set the second PMC switch in the low resistance state or the high resistance state.

4. The programmable interposer of claim 1, wherein the PMC switch includes a PMC element having:
   an insulating material, an ion conductor formed at least partially within the insulating material, an oxidizable electrode positioned proximate to the ion conductor, and an indifferent electrode positioned proximate to the ion conductor.

5. The programmable interposer of claim 4, wherein the ion conductor comprises silicon oxide and copper.

6. The programmable interposer of claim 4, wherein the insulating material comprises the interposer substrate.

7. The programmable interposer of claim 4, wherein the PMC element is a first PMC element, wherein the PMC switch further includes a second PMC element sharing the indifferent electrode of the first PMC element.

8. The programmable interposer of claim 7, further comprising a configuration controller coupled to the PMC switch and configured to set the PMC switch in the low resistance state by applying a switching threshold voltage to the indifferent electrode.

9. The programmable interposer of claim 1, wherein the PMC switch includes a plurality of PMC elements connected in a parallel configuration between the first signal input and the first signal output.

10. A method for programming a programmable interposer for electrically connecting integrated circuits, the programmable interposer comprising an interposer substrate and a programmable metallization cell (PMC) switch formed on the interposer substrate and coupled between a first signal input and a first signal output, wherein the PMC switch is a four-terminal PMC switch coupled between the first signal input, the first signal output, and a second signal output, the method comprising:

electrically configuring one or both of the first signal output and the second signal output of the PMC switch in a low resistance state; and electrically configuring the PMC switch in a high resistance state.

11. The method of claim 10, wherein electrically configuring the PMC switch in the low resistance state includes applying a switching threshold voltage to the PMC switch.

12. The method of claim 10, wherein electrically configuring the PMC switch in the high resistance state includes applying a reverse bias voltage to the PMC switch.

13. An integrated circuit packaging comprising:

a programmable interposer including:

an interposer substrate, and a programmable metallization cell (PMC) switch formed on the interposer substrate and coupled between a first signal input and a first signal output, wherein the PMC switch is electrically configurable between a high resistance state and a low resistance state, wherein the PMC switch is a four-terminal PMC switch coupled between the first signal input, the first signal output, and a second signal output and electrically configurable to set one or both of the first signal output and the second signal output in the low resistance state.

14. The integrated circuit packaging of claim 13, further comprising an integrated circuit component including the first signal input and the first signal output.

15. The integrated circuit packaging of claim 13, further comprising:

a first integrated circuit component including the first signal input; and a second integrated circuit component including the first signal output.

16. The integrated circuit packaging of claim 13, wherein the programmable interposer further including a configuration controller coupled to the PMC switch and configured to set the PMC switch in the low resistance state or the high resistance state.

17. The integrated circuit packaging of claim 16, wherein the configuration controller is further configured to:

set the PMC switch in the low resistance state by applying a switching threshold voltage to the PMC switch, and set the PMC switch in the high resistance state by applying a reverse bias voltage to the PMC switch.

18. The integrated circuit packaging of claim 13, wherein the PMC switch includes a PMC element having:

an insulating material, an ion conductor formed at least partially within the insulating material, an oxidizable electrode positioned proximate to the ion conductor, and an indifferent electrode positioned proximate to the ion conductor.

19. The integrated circuit packaging of claim 13, wherein the PMC switch includes a plurality of PMC elements connected in a parallel configuration between the first signal input and the first signal output.

* * * * *